(12) United States Patent
Song et al.

(10) Patent No.: US 11,653,532 B2
(45) Date of Patent: May 16, 2023

(54) DISPLAY DEVICE

(71) Applicant: LG Display Co., Ltd., Seoul (KR)

(72) Inventors: JiHun Song, Seoul (KR); Moonsun Lee, Sejong (KR); Hoiyong Kwon, Seoul (KR)

(73) Assignee: LG Display Co., Ltd., Seoul (KR)

( * ) Notice: Subject to any disclaimer, the term of this patent is extended or adjusted under 35 U.S.C. 154(b) by 231 days.

(21) Appl. No.: 17/009,142

(22) Filed: Sep. 1, 2020

(65) Prior Publication Data

US 2021/0083024 A1    Mar. 18, 2021

(30) Foreign Application Priority Data

Sep. 17, 2019 (KR) .......................... 10-2019-0114137

(51) Int. Cl.
| | |
|---|---|
| *H01L 27/32* | (2006.01) |
| *H01L 51/00* | (2006.01) |
| *H01L 51/52* | (2006.01) |
| *G02F 1/1333* | (2006.01) |
| *G09F 9/30* | (2006.01) |

(52) U.S. Cl.
CPC .... *H01L 27/3246* (2013.01); *G02F 1/133305* (2013.01); *G02F 1/133308* (2013.01); *G09F 9/301* (2013.01); *H01L 27/3276* (2013.01); *H01L 51/0097* (2013.01); *H01L 51/5253* (2013.01)

(58) Field of Classification Search
CPC ............. H01L 27/3246; H01L 27/3276; H01L 51/0097; H01L 51/5253; G02F 1/133305; G02F 1/133308; G06F 1/1652; G06F 2203/04102; G09F 9/301
See application file for complete search history.

(56) References Cited

U.S. PATENT DOCUMENTS

| | | |
|---|---|---|
| 9,865,670 B2 | 1/2018 | Park et al. |
| 10,586,475 B2 | 3/2020 | Park et al. |
| 2004/0183958 A1* | 9/2004 | Akiyama .................. G09F 9/30 349/58 |
| 2016/0239052 A1 | 8/2016 | Kim et al. |
| 2017/0031388 A1 | 2/2017 | Han et al. |

(Continued)

FOREIGN PATENT DOCUMENTS

| | | |
|---|---|---|
| CN | 106409147 A | 2/2017 |
| CN | 106575664 A | 4/2017 |

(Continued)

OTHER PUBLICATIONS

Extended European Search Report dated Jan. 15, 2021, issued in corresponding European Patent Application No. 20190693.0.

(Continued)

*Primary Examiner* — Kevin Quarterman
(74) *Attorney, Agent, or Firm* — Morgan, Lewis & Bockius LLP

(57) ABSTRACT

A display device includes a display panel including an active area in which a plurality of pixels is defined and a pad area in which pads for applying signals to the plurality of pixels are placed; a back cover placed to overlap the display panel; and a roller configured to wind or unwind the back cover and the display panel and including a flat portion and a curved portion, wherein the pad area is placed to be inclined toward the flat portion.

17 Claims, 19 Drawing Sheets

(56) References Cited

U.S. PATENT DOCUMENTS

| | | | |
|---|---|---|---|
| 2017/0222178 A1 | 8/2017 | Kang et al. | |
| 2017/0318688 A1 | 11/2017 | Kim et al. | |
| 2017/0332496 A1 | 11/2017 | Choi et al. | |
| 2018/0059727 A1 | 3/2018 | Seo et al. | |
| 2019/0098774 A1 | 3/2019 | Park et al. | |
| 2019/0150300 A1* | 5/2019 | Kim | H05K 5/0217 |
| | | | 361/807 |
| 2019/0198783 A1* | 6/2019 | Kim | G06F 1/1652 |
| 2020/0008308 A1* | 1/2020 | Shin | H05K 5/0017 |
| 2020/0093011 A1* | 3/2020 | Lee | G06F 1/1652 |
| 2020/0314552 A1* | 10/2020 | Kim | H04R 7/045 |
| 2021/0240294 A1* | 8/2021 | Ko | G06F 3/0416 |

FOREIGN PATENT DOCUMENTS

| | | |
|---|---|---|
| CN | 107342018 A | 11/2017 |
| CN | 107799010 A | 3/2018 |
| CN | 107993574 A | 5/2018 |
| EP | 3591497 A1 | 8/2020 |
| KR | 10-20160127220 A | 11/2016 |
| KR | 10-2017-0018184 A | 2/2017 |
| KR | 10-1945985 B1 | 2/2019 |
| KR | 10-20190034975 A | 4/2019 |
| KR | 10-1975188 B1 | 5/2019 |

OTHER PUBLICATIONS

Office Action and Search Report issued in corresponding TIPO Patent Application No. 109131854, dated May 25, 2021. Note: KR 10-1945985 cited therein is already of record.

Notice of Reasons for Refusal Office Action issued in corresponding JP Patent Application No. 2020-156560, dated Aug. 25, 2021.

First Notification Office Action issued in corresponding CN Patent Application No. 202010934186.3, dated Jun. 30, 2022.

* cited by examiner

DISPLAY DEVICE

CROSS-REFERENCE TO RELATED APPLICATIONS

This application claims the priority of Korean Patent Application No. 10-2019-0114137 filed on Sep. 17, 2019, in the Korean Intellectual Property Office, the disclosure of which is incorporated herein by reference.

BACKGROUND

Technical Field

The present disclosure relates to a display device, and more particularly, to a rollable display device with improved reliability.

Discussion of the Related Art

The display device used for a computer monitor, a TV, a mobile phone, etc. includes an organic light-emitting display (OLED) that emits light by itself, a liquid-crystal display (LCD) that requires a separate light source, etc.

As the display devices have been increasingly applied to diverse fields such as a computer monitor, a TV, and a personal mobile device, display devices having a large display area and a reduced volume and weight have been studied.

Recently, a rollable display device in which a display part, wiring lines, etc. are formed on a flexible substrate made of flexible plastic and which may display an image even when rolled up has attracted attention as a next-generation display device.

SUMMARY

Accordingly, embodiments of the present disclosure are directed to a display device that substantially obviates one or more of the problems due to limitations and disadvantages of the related art.

An aspect of the present disclosure is to provide a display device in which stress applied to a back cover and a display panel during winding or unwinding of the display device may be minimized.

Another aspect of the present disclosure is to provide a display device in which damage to a pad area of a display panel and a flexible film may be reduced.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described, a display device comprises a display panel including an active area in which a plurality of pixels is defined and a pad area in which pads for applying signals to the plurality of pixels are placed. The display device includes a back cover placed to overlap the display panel. The display device may also comprise a roller configured to wind or unwind the back cover and the display panel and including a flat portion and a curved portion. The pad area may be placed to be inclined toward the flat portion.

In another aspect, a display device comprises a display panel configured to display images and including an active area and a pad area which is extended from one side of the active area and to which a flexible film is attached. The display device may also comprise a back cover configured to be rolled up together with the display panel and a roller including a flat portion and a curved portion. The pad area may be placed to be inclined toward a part of the display panel except the pad area.

Other detailed matters of the exemplary embodiments are included in the detailed description and the drawings.

According to the present disclosure, the pad area of the display panel is placed to be inclined to minimize tensile stress applied to the pad area of the display panel during winding of the display device.

According to the present disclosure, it is possible to suppress cracks of the wiring lines in the pad area or peeling of the flexible film during repeated winding and unwinding of the display panel. Thus, it is possible to improve the reliability of the display device.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain various principles. In the drawings.

DETAILED DESCRIPTION

<Display Device—Rollable Display Device>

Figure 1A:
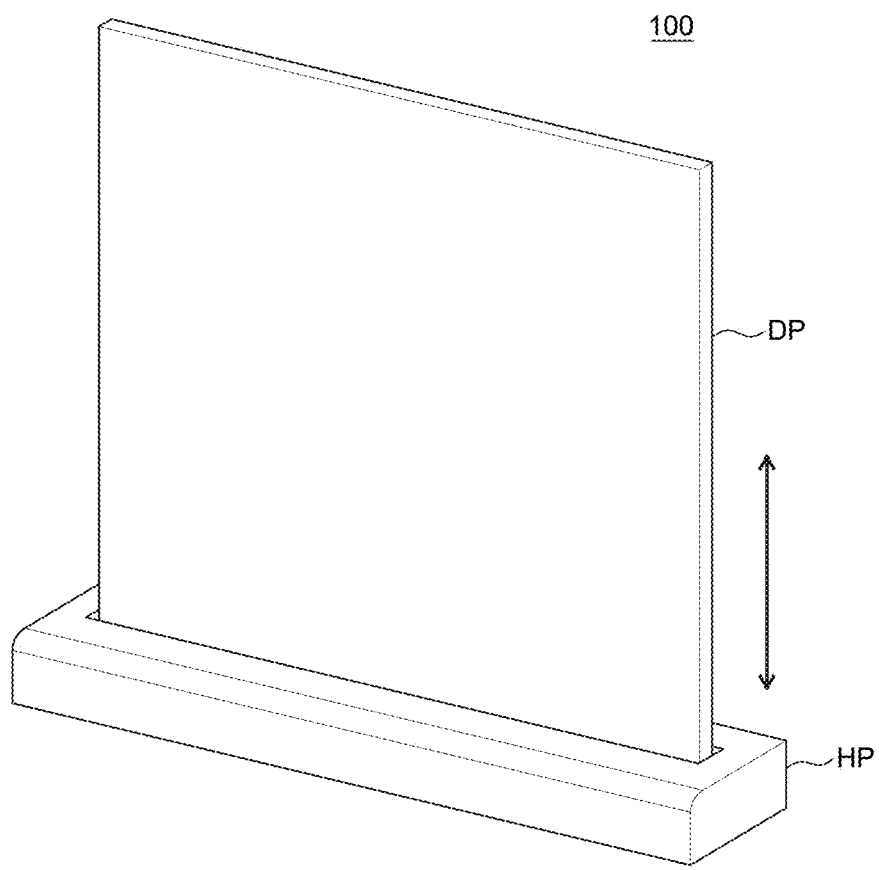
FIG. 1A and FIG. 1B are schematic perspective views of a display device according to an exemplary embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, a light emitting display apparatus according to exemplary embodiments of the present disclosure will be described in detail with reference to accompanying drawings.

A rollable display device may refer to a display device which may display an image even when rolled up. The rollable display device may have higher flexibility than conventional typical display devices. The rollable display device may be freely changed in shape depending on whether the rollable display device is used or not. Specifically, when the rollable display device is not used, the rollable display device may be housed as rolled up to reduce its volume. When the rollable display device is used, the rolled display device may be unrolled again.

Figure 1B:
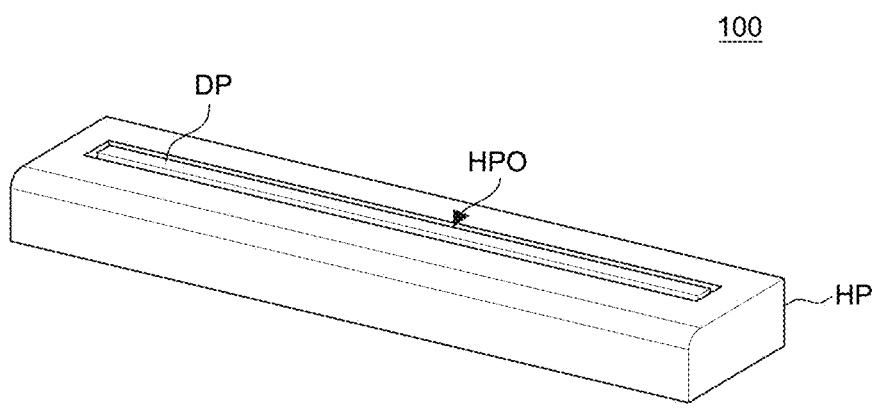

FIG. 1A and FIG. 1B are perspective views of a display device according to an exemplary embodiment of the present disclosure. Referring to FIG. 1A and FIG. 1B, a display device 100 according to an exemplary embodiment of the present disclosure includes a display part DP and a housing part HP.

The display part DP is configured to display images to a user. For example, display elements, circuits for driving the display elements, wiring lines, and other components may be disposed in the display part DP. Herein, the display device 100 according to an embodiment of the present disclosure is a rollable display device. Therefore, the display part DP may be configured to be wound and unwound. For example, the display part DP may include a display panel and a back cover which are flexible so as to be wound or unwound. More details of the display part DP will be described later with reference to FIG. 4 and FIG. 5.

The housing part HP serves as a case where the display part DP may be housed. The display part DP may be wound and then housed inside the housing part HP, and the display part DP may be unwound and then presented outside the housing part HP.

The housing part HP includes an opening HPO through which the display part DP may move in and out of the housing part HP. The display part DP may move up and down through the opening HPO of the housing part HP.

Meanwhile, the display part DP of the display device 100 may change from a full unwinding state to a full winding state, and vice versa.

FIG. 1A shows a full unwinding state of the display part DP of the display device 100. The full unwinding state refers to a state where the display part DP of the display device 100 is presented outside the housing part HP. That is, the full unwinding state may be defined as a state where the display part DP is unwound to a maximum so as not to be further unwound and presented outside the housing part HP in order for the user to watch images on the display device 100.

FIG. 1B shows a full winding state of the display part DP of the display device 100. The full winding state refers to a state where the display part DP of the display device 100 is housed inside the housing part HP and may not be further wound. That is, the full winding state may be defined as a state where the display part DP is wound and housed inside the housing part HP when the user does not watch images on the display device 100 because the display part DP housed inside the housing part HP is preferable for the sake of external appearance. Further, in the full winding state where the display part DP is housed inside the housing part HP, the display device 100 is reduced in volume and easy to transport.

Meanwhile, a moving part for winding or unwinding the display part DP to change the display part DP to the full unwinding state or the full winding state is provided.

<Moving Part>

Figure 2:
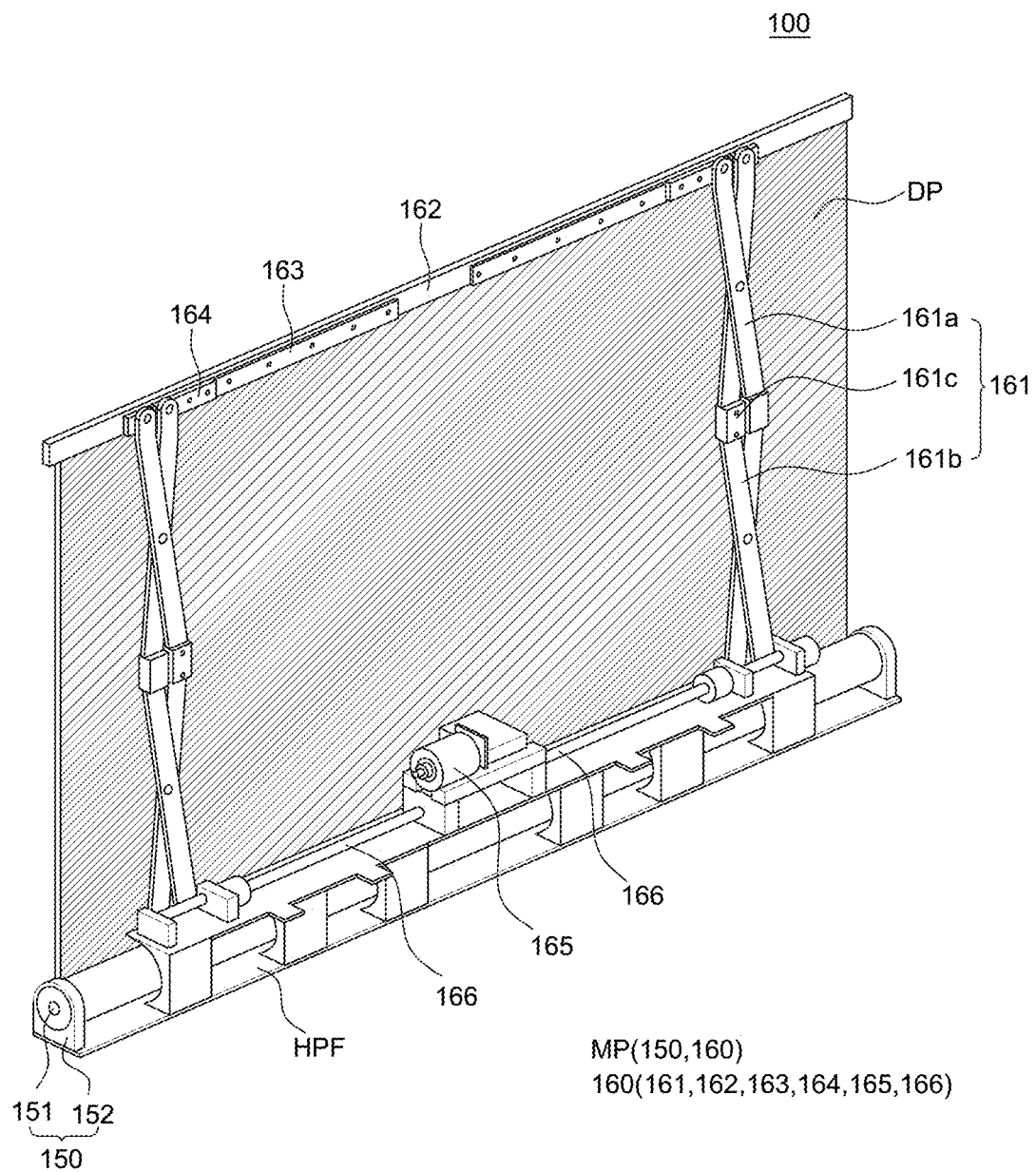
FIG. 2 is a perspective view of the display device according to an exemplary embodiment of the present disclosure.
Figure 3:
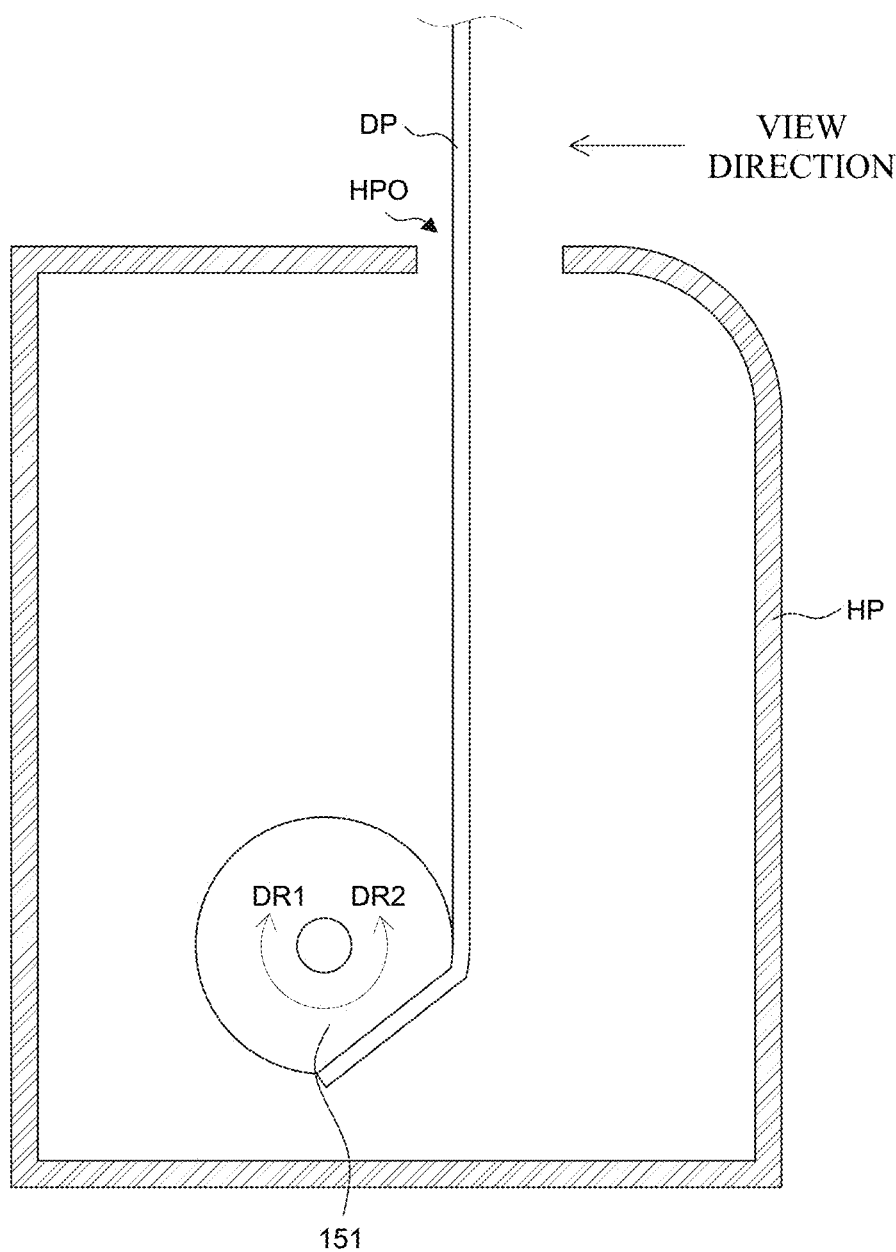
FIG. 3 is a cross-sectional view of the display device according to an exemplary embodiment of the present disclosure.

FIG. 2 is an exploded perspective view of the display device according to an exemplary embodiment of the present disclosure. FIG. 3 is a cross-sectional view of the display device according to an exemplary embodiment of the present disclosure. FIG. 3 is a schematic cross-sectional view provided to explain a roller 151 and the display part DP of the display device 100 according to an exemplary embodiment of the present disclosure. For convenience of description, FIG. 3 illustrates only the housing part HP, the roller 151, and the display part DP.

First, referring to FIG. 2, a moving part MP includes a roller unit 150 and an lifting unit 160.

The roller unit 150 winds or unwinds the display part DP fixed to the roller unit 150 while rotaty clockwise or counterclockwise. The roller unit 150 includes the roller 151 and a roller support 152.

The roller 151 is a member around which the display part DP is wound. The roller 151 may have, e.g., a cylindrical shape. The lower edge of the display part DP may be fixed to the roller 151. When the roller 151 rotates, the display part DP whose lower edge is fixed to the roller 151 may be wound around the roller 151. On the contrary, when the roller 151 rotates in the opposite direction, the display part DP wound around the roller 151 may be unwound from the roller 151.

Referring to FIG. 3, the roller 151 may include at least a part of the outer peripheral surface having a flat surface and the other part having a curved surface to be formed in a cylindrical shape. The roller 151 has a cylindrical shape overall but may be partially flat. That is, a part of the outer peripheral surface of the roller 151 is flat and the other part of the outer peripheral surface is curved. At least one flexible film 130 and a printed circuit board 140 of the display part DP may be mounted on the flat portion of the roller 151. The roller 151 may be a completely cylindrical shape or may have any shape around which the display part DP may be wound, but is not limited thereto.

Referring to FIG. 2 again, the roller support 152 supports the roller 151 from both sides of the roller 151. Specifically, the roller supports 152 are placed on a bottom surface HPF of the housing part HP. Further, upper side surfaces of the roller supports 152 are combined with both ends of the roller 151, respectively. Thus, the roller support 152 may support the roller 151 so as to be spaced apart from the bottom surface HPF of the housing part HP. Herein, the roller 151 may be rotatably combined with the roller support 152.

The lifting unit 160 moves the display part DP up and down according to driving of the roller unit 150. The lifting unit 160 includes a link unit 161, a head bar 162, a slide rail 163, a slider 164, a motor 165, and a rotaty unit 166.

The link unit 161 of the lifting unit 160 includes a plurality of links 161a and 161b and a hinge unit 161c that connects the plurality of links 161a and 161b, respectively. Specifically, the plurality of links 161a and 161b includes a first link 161a and a second link 161b. The first link 161a and the second link 161b are crossed in the form of scissors and rotatably hinged to each other via the hinge unit 161c. Thus, when the link unit 161 moves up and down, the plurality of links 161a and 161b may rotate in a direction to be farther from or closer to each other.

The head bar 162 of the lifting unit 160 is fixed to the uppermost end of the display part DP. The head bar 162 is connected to the link unit 161 and may move the display part DP up and down according to rotation of the plurality of links 161a and 161b of the link unit 161. That is, the display part DP may be moved up and down by the head bar 162 and the link unit 161.

The head bar 162 covers only a part of a surface adjacent to the uppermost edge of the display part DP so as not to cover images displayed on the front surface of the display part DP. The display part DP and the head bar 162 may be fixed by screws, but the present disclosure is not limited thereto.

The slide rail 163 of the lifting unit 160 provides travel paths of the plurality of links 161a and 161b. A part of the plurality of links 161a and 161b may be rotatably combined to the slide rail 163 and its movement may be guided along the track of the slide rail 163. A part of the plurality of links 161a and 161b may be combined to the slider 164 movably provided along the slide rail 163 and moved along the track of the slide rail 163.

The motor 165 may be connected to a power generation unit, such as a separate external power supply or a built-in battery, and supplied with power from the power generation unit. The motor 165 generates rotatory power and supplies driving force to the rotaty unit 166.

The rotaty unit 166 is connected to the motor 165 and configured to covert rotational movement of the motor 165 into linear reciprocal movement. That is, the rotaty unit 166 may convert rotational movement of the motor 165 into linear reciprocal movement of a structure fixed to the rotaty unit 166. For example, the rotaty unit 166 may be implemented as a ball screw including a shaft and a nut combined to the shaft, but is not limited thereto.

The motor 165 and the rotaty unit 166 may lift the display part DP in line with the link unit 161. The link unit 161 has a link structure and may receive driving force from the motor 165 and the rotaty unit 166 and repeatedly perform folding and unfolding operations.

Specifically, when the motor 165 is driven, the structure of the rotaty unit 166 may make linear movement. That is, a part of the rotaty unit 166 connected to one end of the second link 161b may make linear movement. Thus, the one end of the second link 161b may move toward the motor 165. Also, the plurality of links 161a and 161b is folded, and, thus, the height of the link unit 161 may decrease. Further, while the plurality of links 161a and 161b is folded, the head bar 162 connected to the first link 161a is moved down. Also, one end of the display part DP connected to the head bar 162 is also moved down.

Therefore, when the display part DP is fully wound around the roller 151, the link unit 161 of the lifting unit 160 maintains a folded state. That is, when the display part DP is fully wound around the roller 151, the lifting unit 160 may have a minimum height. When the display part DP is fully unwound, the link unit 161 of the lifting unit 160 maintains an unfolded state. That is, when the display part DP is fully unwound, the lifting unit 160 may have a maximum height.

Meanwhile, when the display part DP is wound, the roller 151 may rotate and the display part DP may be wound around the roller 151. For example, referring to FIG. 3, the lower edge of the display part DP is connected to the roller 151. Further, when the roller 151 rotates in a first direction DR1, i.e., clockwise, the display part DP may be wound around the roller 151 so that a rear surface of the display part DP may be closely contacted with a surface of the roller 151.

When the display part DP is unwound, the roller 151 may rotate and the display part DP may be unwound from the roller 151. For example, referring to FIG. 3, when the roller 151 rotates in a second direction DR2, i.e., counterclockwise, the display part DP wound around the roller 151 may be unwound from the roller 151 and then presented outside the housing part HP.

In some embodiments, the moving part MP different in structure from the above-described moving part MP may also be applied to the display device 100. That is, the roller unit 150 and the lifting unit 160 may be changed in configuration as long as the display part DP may be wound and unwound. Some of their components may be omitted or other components may be added.

<Display Part>

Figure 4:
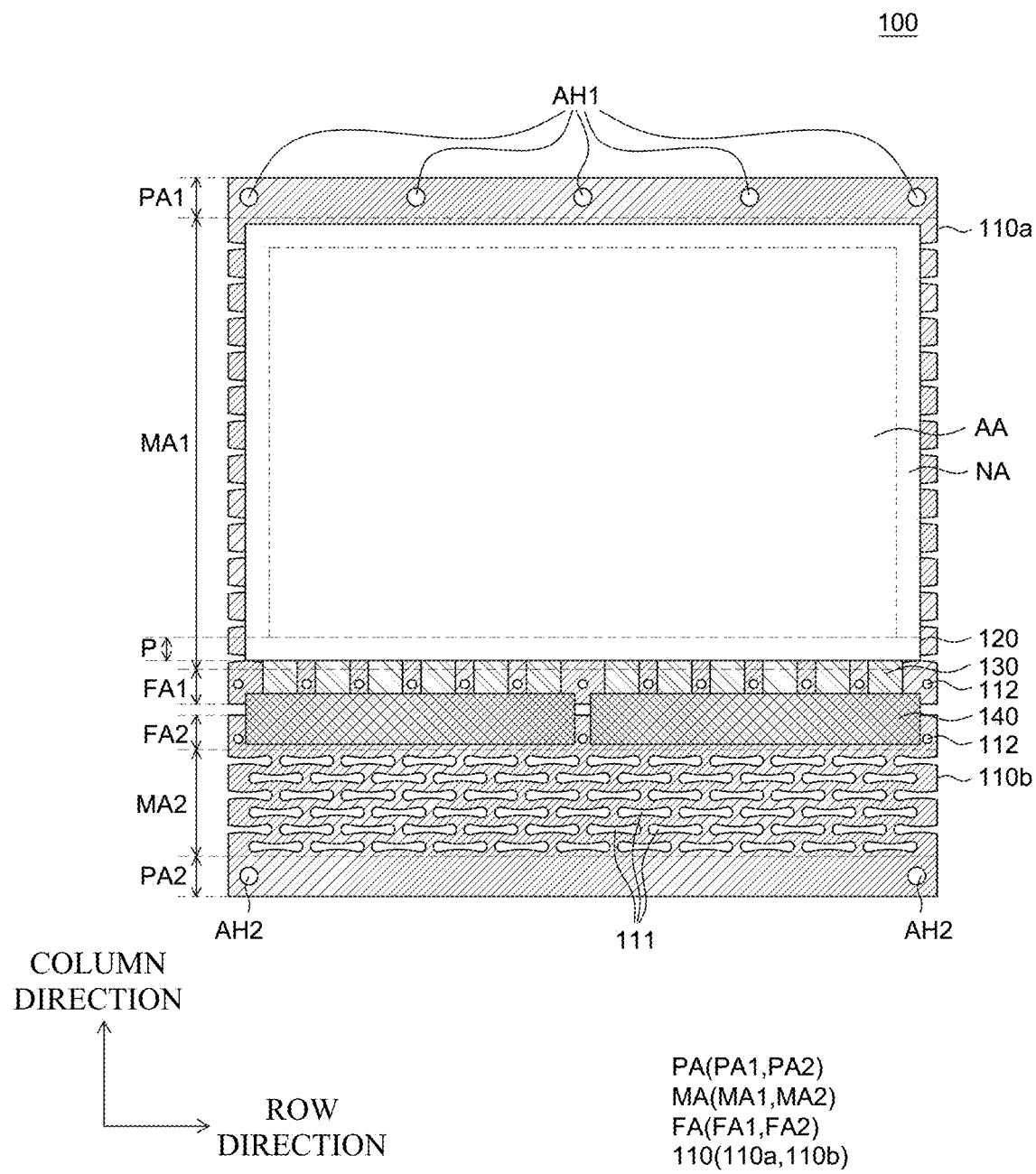
FIG. 4 is a plan view of a display part of the display device according to an exemplary embodiment of the present disclosure.
Figure 5:
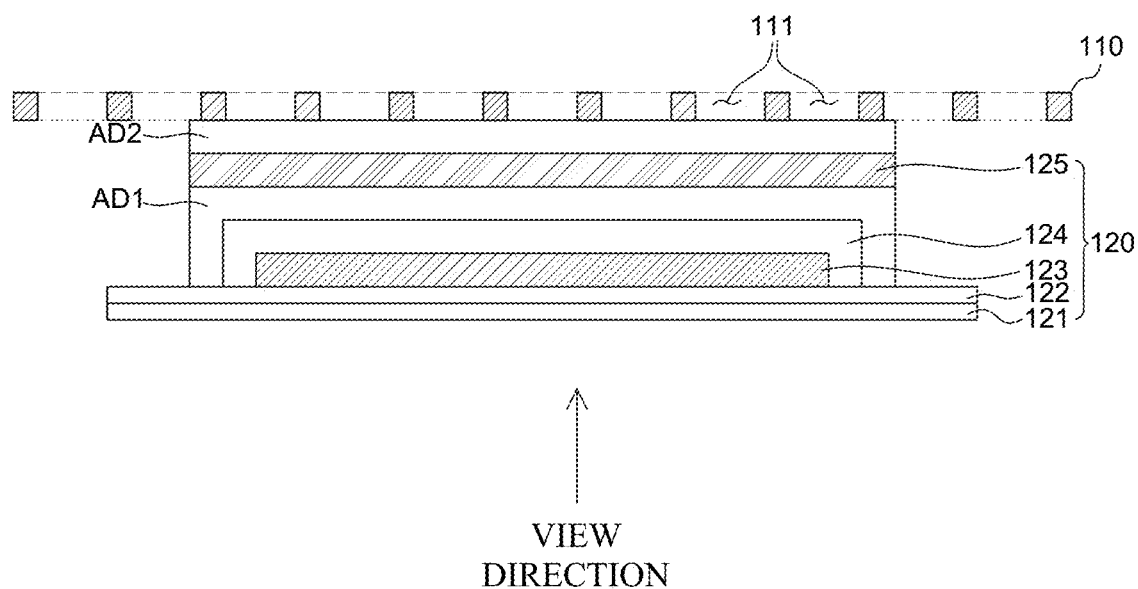
FIG. 5 is a cross-sectional view of the display part of the display device according to an exemplary embodiment of the present disclosure.

FIG. 4 is a plan view of the display part of the display device according to an exemplary embodiment of the present disclosure. FIG. 5 is a cross-sectional view of the display part of the display device according to an exemplary embodiment of the present disclosure.

Referring to FIG. 4, the display part DP includes the back cover 110, the display panel 120, the flexible film 130, and the printed circuit board 140.

The display panel 120 is configured to display images to the user. In the display panel 120, display elements for displaying images, driving elements for driving the display elements, and wiring lines for transmitting various signals to the display elements and the driving elements may be disposed. The display elements may be defined differently depending on the kind of the display panel 120. For example, if the display panel 120 is an organic light emitting display panel, the display elements may be organic light emitting elements each composed of an anode, an organic emission layer, and a cathode. For example, if the display panel 120 is a liquid crystal display panel, the display elements may be liquid crystal display elements. Hereinafter, the display panel 120 will be assumed as an organic light emitting display panel, but the display panel 120 is not limited to the organic light emitting display panel. Further, since the display device 100 according to an embodiment of the present disclosure is a rollable display device, the display panel 120 may be implemented as a flexible display panel to be wound around or unwound from the roller 151.

The display panel 120 includes an active area AA and a non-active area NA.

The active area AA refers to an area where an image is displayed on the display panel 120. In the active area AA, a plurality of pixels including a plurality of sub-pixels and a circuit for driving the plurality of sub-pixels may be disposed. The plurality of sub-pixels is a minimum unit of the active area AA, and a display element may be disposed on each of the plurality of sub-pixels. For example, an organic light emitting element composed of an anode, an organic emission layer, and a cathode may be disposed on each of the plurality of sub-pixels, but the present disclosure is not limited thereto. Further, the circuit for driving the plurality of sub-pixels may include a driving element and a wiring line. For example, the circuit may be composed of a thin film transistor, a storage capacitor, a gate line, a data line, etc., but is not limited thereto.

The non-active area NA refers to an area where an image is not displayed. In the non-active area NA, various wiring lines and circuits for driving the organic light emitting elements in the active area AA may be disposed. For example, link lines for transmitting signals to the plurality of sub-pixels and circuits in the active area AA or driving ICs such as a gate driver IC and a data driver IC may be disposed in the non-active area NA. However, the present disclosure is not limited thereto.

The display panel 120 includes a pad area P. The pad area P may be defined as an area which is extended from one side of the active area AA of the display panel 120 and to which the flexible film 130 is attached. In the pad area P, a plurality of pads connected to various lines of the display panel 120 is disposed. The plurality of pads may be electrically connected to the flexible film 130. The pad area P of the display panel 120 may be disposed on a flat portion 151a adjacent to a curved portion 151b of the roller 151 so as to be inclined toward the flat portion 151a. Also, the pad area P of the display panel 120 may be disposed to be inclined toward a part of the display panel 120 except the pad area P. The pad area P will be described in more detail with reference to FIG. 6A and FIG. 6B.

The flexible film 130 includes various components on a flexible base film and serves to supply signals to the plurality of sub-pixels and circuits in the active area AA. The flexible film 130 may be electrically connected to the display panel 120. The flexible film 130 is placed on one end of the non-active area NA of the display panel 120 and supplies power voltage, data voltage, etc. to the plurality of sub-pixels and circuits in the active area AA. The number of flexible films 130 illustrated in FIG. 5 is just an example and is not limited thereto. The number of flexible films 130 may be changed variously depending on the design.

On the flexible film 130, driving ICs such as a gate driver IC and a data driver IC may be disposed. The driving ICs are configured to process data for displaying an image and a driving signal for processing the data. The driving ICs may be mounted in a Chip On Glass (COG) method, a Chip On Film (COF) method, or a Tape Carrier Package (TCP). For convenience of description, the driving ICs are described as mounted on the flexible film 130 in the COF method, but the present disclosure is not limited thereto.

The printed circuit board 140 is disposed on one end of the flexible film 130 and connected to the flexible film 130. The printed circuit board 140 is configured to supply signals to the driving ICs. The printed circuit board 140 supplies various signals such as a driving signal, a data signal, etc. to the driving ICs. In the printed circuit board 140, various components may be disposed. For example, a timing controller, a power supply unit, etc. may be disposed on the printed circuit board 140. Meanwhile, FIG. 4 illustrates two printed circuit boards 140. However, the number of printed circuit boards 140 is not limited thereto and may be changed variously depending on the design.

Meanwhile, although not illustrated in FIG. 4, an additional printed circuit board connected to the printed circuit board 140 may be further disposed. For example, the printed circuit board 140 may be referred to as a source printed circuit board (source PCB) S-PCB on which a data driver is mounted. The additional printed circuit board connected to the printed circuit board 140 may be referred to as a control printed circuit board (control PCB) C-PCB on which a timing controller or the like is mounted. The additional printed circuit board may be disposed inside the roller 151, or may be disposed within the housing part HP outside the roller 151.

The back cover 110 is disposed on rear surfaces of the display panel 120, the flexible film 130, and the printed circuit board 140 and supports the display panel 120, the flexible film 130, and the printed circuit board 140. Thus, the back cover 110 may be larger in size than the display panel 120. The back cover 110 may protect the other components of the display part DP against the external environment. The back cover 110 may be formed of a rigid material, but at least a part of the back cover 110 may have flexibility so as to be wound or unwound along with the display panel 120. For example, the back cover 110 may be formed of a metal material such as Steel Use Stainless (SUS) or Invar, or plastic. However, the material of the back cover 110 is not limited thereto. The material of the back cover 110 may be changed variously depending on the design as long as it may satisfy physical property requirements such as amount of thermal deformation, radius of curvature, rigidity, etc.

The back cover 110 includes a plurality of support areas PA, a fixing area FA and a plurality of flexible areas MA. In the plurality of support areas PA and the fixing area FA, a plurality of openings 111 is not disposed. In the plurality of flexible areas MA, the plurality of openings 111 is disposed. Specifically, a first support area PA1, a first flexible area MA1, the fixing area FA, a second flexible area MA2 and a second support area PA2 are disposed in sequence from the uppermost end of the back cover 110.

The first support area PA1 of the back cover 110 is the uppermost area of the back cover 110 and combined to the head bar 162. The first support area PA1 includes first alignment holes AH1 so as to be combined to the head bar 162. In this case, the first support area PA1 may be combined to head bar 162 by means of screws, but is not limited thereto. Since the first support area PA1 is combined to the head bar 162, the back cover 110 may move up or down at the same time when the link unit 161 combined to the head bar 162 moves up or down. The display panel 120 attached to the back cover 110 may also move up or down. FIG. 4 illustrates five first alignment holes AH1, but the number of first alignment holes AH1 is not limited thereto. Further, FIG. 4 illustrates that the back cover 110 is combined to the head bar 162 using the first alignment holes AH1. However, the present disclosure is not limited thereto. The back cover 110 may be combined to the head bar 162 without separate alignment holes.

The first flexible area MA1 is extended from the first support area PA1 to the lower side of the back cover 110. In the first flexible area MA1, the plurality of openings 111 is disposed. The display panel 120 is attached to the first flexible area MA1.

When the display part DP is wound around the roller 151 so as to be housed inside the housing part HP, the first flexible area MA1 of the back cover 110 may be wound around the roller 151. A lower end portion and a central portion of the display panel 120 attached to the first flexible area MA1 may also be wound around the roller 151. Here, the first flexible area MA1 of the back cover 110 includes the plurality of openings 111. Thus, the first flexible area MA1 of the back cover 110 may have high flexibility and may be easily wound around the roller 151 together with the display panel 120.

The fixing area FA is extended from the first flexible area MA1 to the lower side of the back cover 110. The fixing area FA enables the flexible film 130 and the printed circuit board 140 to be wound so as not to be curved but to be flat around the roller 151 to protect the flexible film 130 and the printed circuit board 140. Further, the roller 151 may also be partially flat corresponding to the fixing area FA.

A plurality of fixing holes 112 is disposed in the fixing area FA. Each of the plurality of fixing holes 112 is disposed between flexible films 130. Thus, it is possible to more stably fix the flexible films 130 and the printed circuit board 140 together with a base plate 170 and a top cover 180 combined through the plurality of fixing holes 112. During winding or unwinding of the display part DP, the flexible films 130 and the printed circuit board 140 disposed in the fixing area FA may not be fixed but may be shaken. Specifically, during winding or unwinding of the display part DP, the fixing area FA of the back cover 110 may be applied with stress caused by contraction or expansion. Therefore, the plurality of fixing holes 112 in the fixing area FA may be formed to clamp the base plate 170 and the top cover 180. Thus, the flexible films 130 and the printed circuit boards 140 disposed between the base plate 170 and the top cover 180 may be fixed. Meanwhile, the number of a plurality of fixing holes 112 illustrated in FIG. 4 is just an example and may be determined based on the number of printed circuit boards 140, the number of flexible films 130, etc. Details of the plurality of fixing holes 112 will be described later with reference to FIG. 8.

Meanwhile, the back cover 110 may be divided into a first back cover 110a and a second back cover 110b with a plurality of fixing holes 112 in a first fixing area FA1 and a plurality of fixing holes 112 in a second fixing area FA2 interposed therebetween. That is, the first back cover 110a includes the first support area PA1, the first flexible area MA1 and the first fixing area FA1, and the second back cover 110b includes the second fixing area FA2, the second flexible area MA2 and the second support area PA2. However, the present disclosure is not limited thereto. The back cover 110 may be formed as one body.

The second flexible area MA2 is extended from the fixing area FA to the lower side of the back cover 110. Further, in the second flexible area MA2, the plurality of openings 111 is disposed.

The second flexible area MA2 is extended to enable an active area AA of the display panel 120 to be presented outside the housing part HP. For example, when the back cover 110 and the display panel 120 are in the full unwinding state, an area ranging from the second support area PA2 of the back cover 110 fixed to the roller 151 to the fixing area FA to which the flexible film 130 and the printed circuit board 140 are attached may be placed inside the housing part HP. At the same time, the first flexible area MA1 to which the display panel 120 is attached and the fixing area FA may be presented outside the housing part HP. In this case, if a length from the second support area PA2 fixed to the roller 151 to the second flexible area MA2 and the fixing area FA is smaller than a length from the second support area PA2 to the opening HPO of the housing part HP, a part of the first flexible area MA1 to which the display panel 120 is attached may be placed inside the housing part HP. Since a part of a lower end of the active area AA of the display panel 120 is placed inside the housing part HP, it may be difficult to watch images. Therefore, the length from the second support area PA2 fixed to the roller 151 to the second flexible area MA2 and the fixing area FA may be designed to be equal to the length from the second support area PA2 fixed to the roller 151 to the opening HPO of the housing part HP.

The second support area PA2 of the back cover 110 is the lowermost area of the back cover 110 and combined and fixed to the roller 151. The second support area PA2 may include second alignment holes AH2 so as to be combined to the roller 151. In this case, the second support area PA2 may be combined to the roller 151 by screws, but is not limited thereto. Since the second support area PA2 is combined to the roller 151, the back cover 110 may be wound around or unwound from the roller 151 as the roller 151 is rotated. FIG. 4 illustrates two second alignment holes AH2, but the number of second alignment holes AH2 is not limited thereto. Also, FIG. 4 illustrates that the back cover 110 is combined to the roller 151 using the second alignment holes AH2. However, the present disclosure is not limited thereto. The back cover 110 may be fixed to the roller 151 without alignment holes.

The flexible area MA of the back cover 110 is wound around or unwound from the roller 151 along with the display panel 120. The flexible area MA may overlap at least the display panel 120 among the other components of the display part DP.

The plurality of openings 111 is disposed in the flexible area MA of the back cover 110. During winding or unwinding of the display part DP, the plurality of openings 111 may be deformed by stress applied to the display part DP. Specifically, during winding or unwinding of the display part DP, the flexible area MA of the back cover 110 may be deformed as the plurality of openings 111 contracts or expands. Further, since the plurality of openings 111 contracts or expands, a slip phenomenon of the display panel 120 disposed on the flexible area MA of the back cover 110 may be minimized. Therefore, stress applied to the display panel 120 may be minimized.

Referring to FIG. 4, the plurality of openings 111 is misaligned with the plurality of openings 111 of adjacent rows. For example, the plurality of openings 111 of one row is misaligned with the plurality of openings 111 of rows adjacent to the corresponding row. Specifically, the centers of the plurality of openings 111 in odd-numbered rows may be misaligned with the centers of the plurality of openings 111 in even-numbered rows by as much as, e.g., ½ of a row-direction width 111WR of each opening 111. However, the placement of the plurality of openings 111 shown in FIG. 4 is just an example, but is not limited thereto.

In this case, the plurality of openings 111 formed in the flexible area MA is not formed in the first support area PA1 and the second support area PA2. That is, only the first alignment holes AH1 and the second alignment holes AH2 are formed in each of the first support area PA1 and the second support area PA2. However, the plurality of openings 111 formed in the flexible area MA is not formed in the first support area PA1 and the second support area PA2. Further, the first alignment holes AH1 and the second alignment holes AH2 are different in shape from the plurality of openings 111. The first support area PA1 and the second support area PA2 are fixed to the head bar 164 and the roller 151, respectively. Thus, the first support area PA1 and the second support area PA2 need to have higher rigidity than the flexible area MA. Specifically, since the first support area PA1 and the second support area PA2 have rigidity, the first support area PA1 and the second support area PA2 may be securely fixed to the head bar 164 and the roller 151. Therefore, the display part DP is fixed to the roller 151 and the head bar 164 of the moving part MP and may move in or out of the housing part HP according to an operation of the moving part MP. In the display device 100 according to an embodiment of the present disclosure, the back cover 110 including the plurality of openings 111 is disposed on the rear surface of the display panel 120 to support and protect the display panel 120. The back cover 110 may be formed of a metal material and thus may have rigidity. Also, the flexible area MA of the back cover 110 in which the display panel 120 is disposed includes the plurality of openings 111, and, thus, the back cover 110 may have improved flexibility. Therefore, in the full unwinding state in which the display part DP of the display device 100 is presented outside the housing part HP, the back cover 110 formed of a rigid material and having high rigidity may support the display panel 120 to be spread flat. In the full winding state in which the display part DP of the display device 100 is housed inside the housing part HP, the back cover 110 having high flexibility due to the plurality of openings 111 may be wound around the roller 151 and housed together with the display panel 120.

Further, in the display device 100 according to an exemplary embodiment of the present disclosure, the back cover 110 includes the first back cover 110a and the second back cover 110b spaced apart from each other. Thus, the back cover 110 may be formed so as to correspond to various sizes of the display panel 120. As the size of the display device 100 increases, the size of the display panel 120 also increases. In this case, the back cover 110 needs to be larger in size than the display panel 120. Therefore, the single back cover 110 needs to be manufactured to a large size. However, it is very difficult to manufacture the single back cover 110 corresponding to a large-size display device. Accordingly, in the display device 100 according to an exemplary embodiment of the present disclosure, the back cover 110 is configured including the first back cover 110a and the second back cover 110b. Thus, the first back cover 110a and the second back cover 110b which are smaller in size than the display device 100 may be used. Also, the first back cover 110a and the second back cover 110b are fixed by the base plate 170, the bottom cover 190, the back cover 110, the top cover 180, and fixing members FM. Therefore, the first back cover 110a and the second back cover 110b may function as the existing back cover 110. Also, the back cover 110 may be manufactured in smaller sizes, and, thus, the productivity may be improved.

Referring to FIG. 5, the display panel 120 includes a substrate 121, a buffer layer 122, a pixel unit 123, an encapsulation layer 124, and an encapsulation substrate 125.

The substrate 121 serves as a base member to support various components of the display panel 120 and may be formed of an insulating material. The substrate 121 may be formed of a flexible material in order for the display panel 120 to be wound or unwound. For example, the substrate 121 may be formed of a plastic material such as polyimide (PI).

The buffer layer 122 may suppress diffusion of moisture and/or oxygen permeating from the outside of the substrate 121. The buffer layer 122 may be formed as a single layer or a multilayer of silicon oxide (SiOx) and silicon nitride (SiNx), but is not limited thereto.

The pixel unit 123 includes a plurality of organic light emitting elements and circuits for the organic light emitting elements. The pixel unit 123 may correspond to the active area AA. Each organic light emitting element may include an anode, an organic emission layer, and a cathode.

The anode may supply holes into the organic emission layer and may be formed of a conductive material having a high work function. For example, the anode may be formed of tin oxide (TO), indium tin oxide (ITO), indium zinc oxide (IZO), indium zinc tin oxide (ITZO), or the like, but is not limited thereto.

The organic emission layer may receive holes from the anode and electrons from the cathode and emit light. The organic emission layer may be one of a red organic emission layer, a green organic emission layer, a blue organic emission layer, and a white organic emission layer depending on the color of light emitted from the organic emission layer. If the organic emission layer is a white organic emission layer, color filters of various colors may be further provided.

The cathode may supply electrons into the organic emission layer and may be formed of a conductive material having a low work function. For example, the cathode may be formed of one or more materials selected from the group consisting of metals such as magnesium (Mg), silver (Ag), and aluminum (Al) and alloys thereof, but is not limited thereto.

Meanwhile, the display panel 120 may be classified into a top emission type or a bottom emission type according to a transmission direction of light emitted from the organic light emitting element.

In the top emission type, light emitted from the organic light emitting element is emitted toward the upper side of the substrate 121 on which the organic light emitting element is formed. If the display panel 120 is of top emission type, a reflective layer may be further provided under the anode. This is to discharge light emitted from the organic light emitting element toward the upper side of the substrate 121, i.e., toward the cathode.

In the bottom emission type, light emitted from the organic light emitting element is emitted toward the lower side of the substrate 121 on which the organic light emitting element is formed. If the display panel 120 is of bottom emission type, the anode may be formed of a transparent conductive material only and the cathode may be formed of a metal material having high reflectivity. This is to discharge light emitted from the organic light emitting element toward the lower side of the substrate 121.

Hereafter, for convenience of description, the display device 100 according to an embodiment of the present disclosure will be described as a bottom emission type display device, but is not limited thereto.

In the pixel unit 123, a circuit for driving organic light emitting elements is disposed. The circuit may be composed of a TFT, a storage capacitor, a gate line, a data line, a power line, etc. The components of the circuit may be changed variously depending on the design of the display device 100.

The encapsulation layer 124 covering the pixel unit 123 is disposed on the pixel unit 123. The encapsulation layer 124 seals the organic light emitting elements of the pixel unit 123. The encapsulation layer 124 may protect the organic light emitting elements of the pixel unit 123 against external moisture, oxygen, and impacts. The encapsulation layer 124 may be formed by alternately laminating a plurality of inorganic layers and a plurality of organic layers. For example, the inorganic layers may be formed of inorganic materials such as silicon nitride (SiNx), silicon oxide (SiOx), and aluminum oxide (AlOx), but are not limited thereto. For example, the organic layers may be formed of epoxy-based or acryl-based polymers, but are not limited thereto.

The encapsulation substrate 125 is disposed on the encapsulation layer 124. The encapsulation substrate 125 protects the organic light emitting elements of the pixel unit 123 together with the encapsulation layer 124. The encapsulation substrate 125 may protect the organic light emitting elements of the pixel unit 123 against external moisture, oxygen, and impacts. The encapsulation substrate 125 may be formed of a metal material which has high corrosion resistance and may be easily processed into foil or thin film. Examples of the metal material may include aluminum (Al), nickel (Ni), chromium (Cr), and an alloy of iron (Fe) and Ni. Since the encapsulation substrate 125 is formed of a metal material, the encapsulation substrate 125 may be implemented in the form of an ultra-thin film and may provide high resistance to external impacts and scratches.

A first adhesive layer AD1 may be disposed between the encapsulation layer 124 and the encapsulation substrate 125. The first adhesive layer AD1 may bond the encapsulation layer 124 and the encapsulation substrate 125. The first adhesive layer AD1 may be formed of an adhesive material and may be a thermosetting or naturally curable adhesive. For example, the first adhesive layer AD1 may be formed of an optical clear adhesive (OCA), a pressure sensitive adhesive (PSA), or the like, but is not limited thereto.

Meanwhile, the first adhesive layer AD1 may be disposed to cover the encapsulation layer 124 and the pixel unit 123. That is, the pixel unit 123 may be sealed by the buffer layer 122 and the encapsulation layer 124 and the encapsulation layer 124 and the pixel unit 123 may be sealed by the buffer layer 122 and the first adhesive layer AD1. The first adhesive layer AD1 may protect the organic light emitting elements of the pixel unit 123 against external moisture, oxygen, and impacts together with the encapsulation layer 124 and the encapsulation substrate 125. Herein, the first adhesive layer AD1 may further contain a moisture absorbent. The moisture absorbent may include hygroscopic particles and may absorb moisture and oxygen from the outside to minimize permeation of moisture and oxygen into the pixel unit 123.

The back cover 110 is disposed on the encapsulation substrate 125. The back cover 110 may be disposed to be in contact with the encapsulation substrate 125 of the display panel 120 to protect the display panel 120. The back cover 110 may be formed of a rigid material to protect the display panel 120.

A second adhesive layer AD2 is disposed between the encapsulation substrate 125 and the back cover 110. The second adhesive layer AD2 may bond the encapsulation substrate 125 and the back cover 110. The second adhesive layer AD2 may be formed of an adhesive material and may be a thermosetting or naturally curable adhesive. For example, the second adhesive layer AD2 may be formed of an optical clear adhesive (OCA), a pressure sensitive adhesive (PSA), or the like, but is not limited thereto.

FIG. 5 illustrates that a plurality of openings 111 of the back cover 110 is not filled with the second adhesive layer AD2. However, some or all of the plurality of openings 111 of the back cover 110 may be filled with the second adhesive layer AD2. When the second adhesive layer AD2 fills in the plurality of openings 111 of the back cover 110, a contact area between the second adhesive layer AD2 and the back cover 110 increases. Thus, it is possible to suppress separation therebetween.

Meanwhile, although not illustrated in FIG. 5, a light transmitting film may be further disposed on a rear surface of the substrate 121. The light transmitting film may function to protect a front surface of the display panel 120 or minimize reflection of external light incident into the display panel 120. For example, the light transmitting film may be at least one of a polyethyleneterephthalate (PET) film, an anti-reflection film, a polarizing film, and a transmittance controllable film, but is not limited thereto.

<Support Member>

Figure 6A:
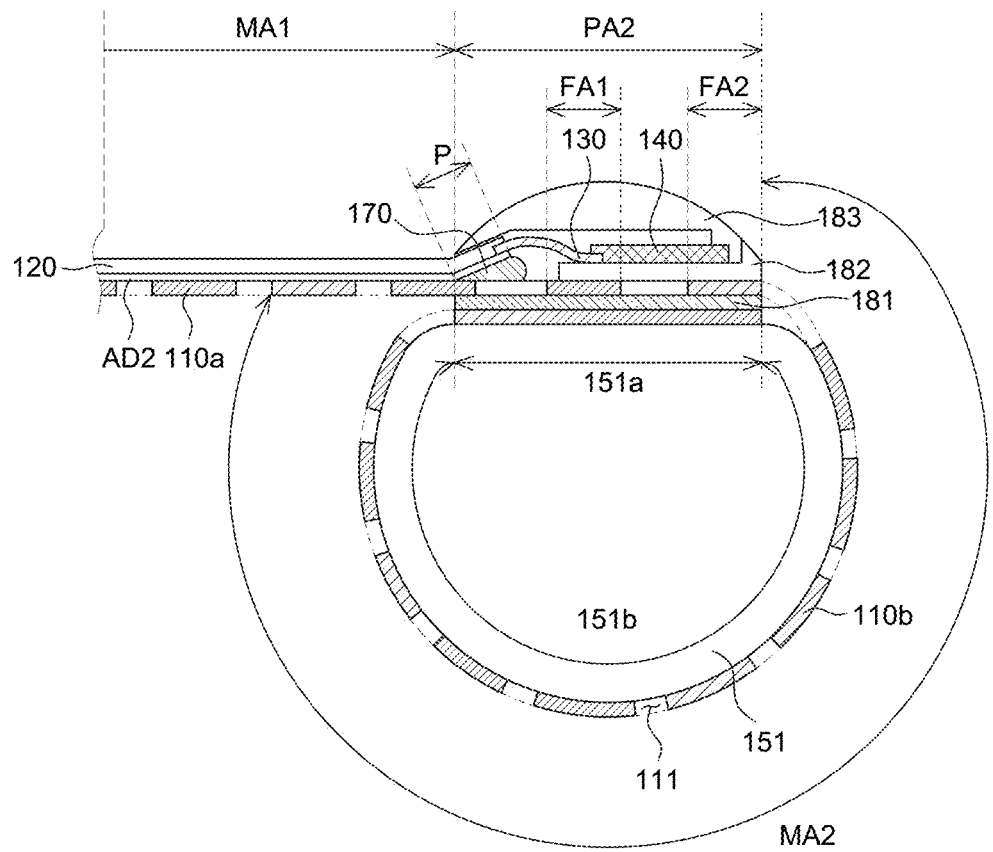
FIG. 6A and FIG. 6B are cross-sectional views of the display device according to an exemplary embodiment of the present disclosure.
Figure 6B:
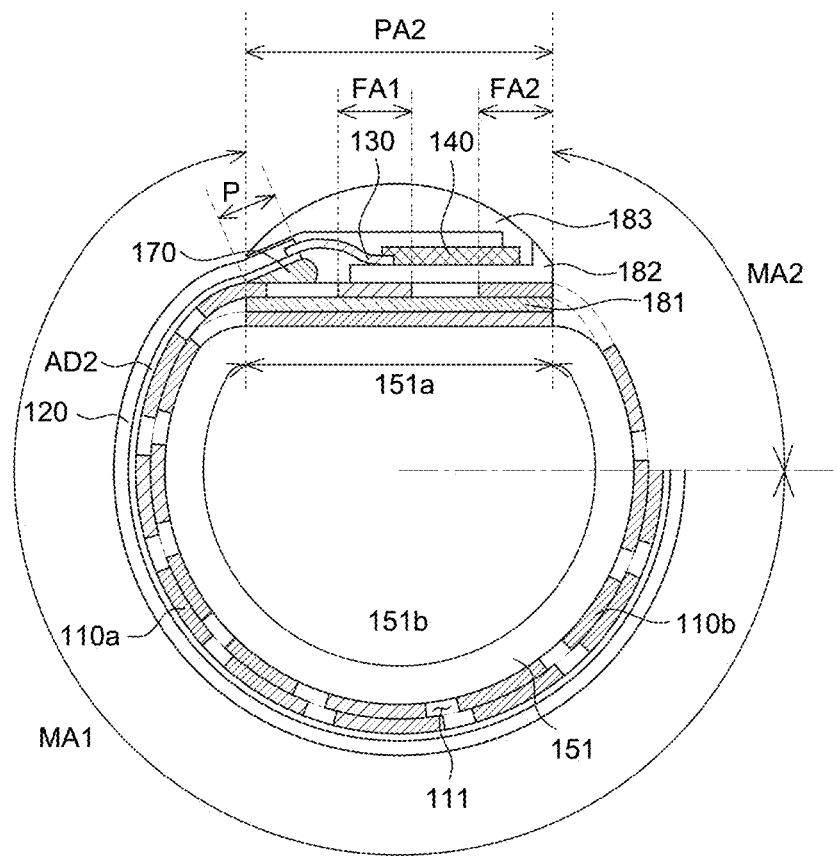

FIG. 6A and FIG. 6B are cross-sectional views of the display device according to an exemplary embodiment of the present disclosure. FIG. 6A is a cross-sectional view illustrating a state where the second back cover 110b is wound around the roller 151. FIG. 6B is a cross-sectional view illustrating a state where a part of the first back cover 110a is further wound around the roller 151. In FIG. 6A and FIG. 6B, the illustration of the link unit 161, the head bar 162 and the like is omitted for convenience in illustration.

First, referring to FIG. 6A and FIG. 6B, the display device 100 includes a structure. Specifically, the structure may include a base plate 181, a bottom cover 182 and a top cover 183.

The base plate 181 may be disposed to support a part of a surface opposite to one surface of the back cover 110 on which the display panel 120 is disposed. Specifically, the base plate 181 may be disposed between the second support area PA2 of the second back cover 110b and the fixing area FA of the first back cover 110a on the flat portion 151a of the roller 151. Thus, the base plate 181 may be formed to have a length corresponding to the length of the flat portion 151a of the roller 151, but is not limited thereto.

The base plate 181 may be combined with the top cover 183 to fix the back cover 110 and the display panel 120 interposed between the base plate 181 and the display panel 120. For example, although not illustrated in FIG. 6A and FIG. 6B, fixing protrusions protruding toward the top cover 183 may be formed in the base plate 181. The fixing protrusions may penetrate the back cover 110, the bottom cover 182 and the top cover 183 and then may be combined to a fixing unit inserted through the top cover 183. Thus, the fixing protrusions may fix the structure disposed between the base plate 181 and the top cover 183. The fixing protrusions of the base plate 181 may be formed as, e.g., pem nuts, and may include screw threads therein. Thus, the fixing unit may be combined to the fixing protrusions so that the base plate 181 may be combined with the top cover 183.

The bottom cover 182 may be disposed on the fixing area FA of the first back cover 110a on the base plate 181. As the fixing protrusions protruding from the base plate 181 penetrate the bottom cover 182, the bottom cover 182 may be fixed to the base plate 181. Thus, holes through which the fixing protrusions of the base plate 181 may penetrate may be disposed in the bottom cover 182. Also, the flexible film 130 and the printed circuit board 140 may be disposed and mounted on the bottom cover 182 so that the flexible film 130 and the printed circuit board 140 may be fixed.

The top cover 183 may be disposed above the bottom cover 182 so as to cover the pad area P of the display panel 120, the flexible film 130 and the printed circuit board 140. Thus, a part of an inner peripheral surface of the top cover 183 corresponding to the pad area P may be formed in a shape corresponding to the inclination of the pad area P. That is, a part of the inner peripheral surface of the top cover 183 corresponding to the pad area P may have a inclined surface at the same inclination as the pad area P.

The top cover 183 may have a curved outer peripheral surface. The top cover 183 has a curved outer peripheral surface so as to follow the shape of the back cover 110 being rolled up. In this case, the curved outer peripheral surface of the top cover 183 may have the same radius of curvature as the roller 151. That is, when the top cover 183 is disposed on the flat portion 151a of the roller 151, the top cover 183 may have an outer peripheral surface having substantially the same radius of curvature as the roller 151 so as to have a substantially circular shape. Thus, during winding of the display device 100, the back cover 110 and the display panel 120 may be wound around the roller 151 so as to have a substantially circular shape.

The top cover 183 may include holes corresponding to the fixing protrusions of the base plate 181 so that the fixing unit may be combined to the fixing protrusions through the holes. Thus, the top cover 183 may be combined with the base plate 181 and the bottom cover 182 and thus may protect the flexible film 130 and the printed circuit board 140. Therefore, the top cover 183 may be formed of an insulating material such as resin, but is not limited thereto. Further, a component for protecting the flexible film 130 and the printed circuit board 140 and also fixing the flexible film 130 and the printed circuit board 140 to the back cover 110 is not limited to the top cover 183. Various structural components may be used therefor.

Referring to FIG. 6A, the display device 100 further includes a support member 170. The support member 170 may be disposed between the display panel 120 and the back cover 110 in the pad area P. One surface of the support member 170 may be inclined at an inclination corresponding to the pad area P so as to support the pad area P. That is, the support member 170 may have an inclined surface corresponding to the pad area P. Thus, during winding or unwinding of the display device 100, the support member 170 enables the pad area P of the display panel 120 to maintain a shape inclined toward the flat portion 151a of the roller 151. Therefore, the support member 170 may reduce stress applied to the pad area P of the display panel 120.

The support member 170 may be fixed to the pad area P and the back cover 110 by the second adhesive layer AD2 that bonds the display panel 120 and the back cover 110. For example, the support member 170 is formed of a plastic-based material so that inclination of the one surface of the support member 170 may be easily changed according to the inclination of the pad area P. Also, the support member 170 is formed of an adhesive material and thus may be fixed to a rear surface of the display panel 120 and an upper surface of the back cover 110 without a separate adhesive member.

The end of the support member 170 may be disposed corresponding to the end of the flat portion 151a of the roller 151. For example, if the end of the support member 170 protrudes more than the end of the flat portion 151a of the roller 151, the support member 170 may interfere with winding of the back cover 110 and the display panel 120 along the curve of the roller 151. Therefore, the end of the support member 170 is disposed corresponding to the end of the flat portion 151a of the roller 151. Thus, during winding of the display device 100, it is possible to reduce interference with winding of the back cover 110 and the display panel 120 by the support member 170.

Referring to FIG. 6A, when the second back cover 110b is wound around the roller 151, the second support area PA2 of the second back cover 110b may be disposed on the flat portion 151a of the roller 151. Also, the second flexible area MA2 of the second back cover 110b may be wound around the curved portion 151b of the roller 151. Further, the second fixing area FA2 of the second back cover 110b and the first fixing area FA1 of the first back cover 110a may be disposed on the second support area PA2 of the second back cover 110b.

Referring to FIG. 6B, when the second support area PA2, the second flexible area MA2 and the second fixing area FA2 of the second back cover 110b and the first fixing area FA1 of the first back cover 110a are wound around the roller 151, a part of the active area of the display panel 120 and the first flexible area of the first back cover 110a are further wound around the roller 151. In this case, a part of the active area of the display panel 120 and the first flexible area of the first back cover 110a may be wound on the second flexible area of the second back cover 110b.

Meanwhile, although not illustrated in FIG. 6A and FIG. 6B, if the first back cover 110a and the display panel 120 are in the full winding state, another part of the active area of the display panel 120 and another part of the first flexible area MA1 of the first back cover 110a may be wound to overlap the top cover 183. In this case, the top cover 183 is disposed on the curved portion 151b and the flat portion 151a of the roller 151. Therefore, another part of the active area of the display panel 120 and another part of the first flexible area MA1 of the first back cover 110a may be wound around the roller 151 along the curve of the roller 151 and the top cover 183.

In a roller of a general rollable display device, a curved portion adjacent to a flat portion may have a smaller radius of curvature than another part of the curved portion. Thus, when the rollable display device is wound, a display panel disposed on the curved portion adjacent to the flat portion of the roller and/or the boundary between the flat portion and the curved portion is applied with relatively high tensile stress. Accordingly, a pad area of the display panel corresponding to the curved portion adjacent to the flat portion of the roller and/or the boundary between the flat portion and the curved portion is applied with high tensile stress. Thus, pads, wiring lines or an insulating layer disposed in the pad area may be cracked.

In the display device 100 according to an exemplary embodiment of the present disclosure, the support member 170 is disposed in order for the pad area P of the display panel 120 to be inclined toward the flat portion 151a. Therefore, during winding or unwinding of the display device 100, stress applied to the display panel 120 may be reduced. Specifically, the support member 170 may have an inclined surface and the pad area P of the display panel 120 may be disposed to be inclined toward the flat portion 151a by the one surface of the support member 170. Thus, the support member 170 may support inclination of the pad area P. Accordingly, before the pad area P is wound, the pad area P is disposed to be applied with compressive stress. Then, when the pad area P is wound, compressive stress applied to the pad area P decreases. Therefore, actually, stress may not be applied to the pad area P. Even if tensile stress is generated, the amount of tensile stress applied to the pad area P may be reduced, as compared with a case where the support member 170 is not used. Therefore, the support member 170 is disposed to support the inclined pad area P of the display panel 120. Thus, during winding or unwinding of the display device 100, stress applied to the pad area P may be reduced and damage to the display panel 120 may be reduced.

<Support Member Supporting Back Cover>

Figure 7A:
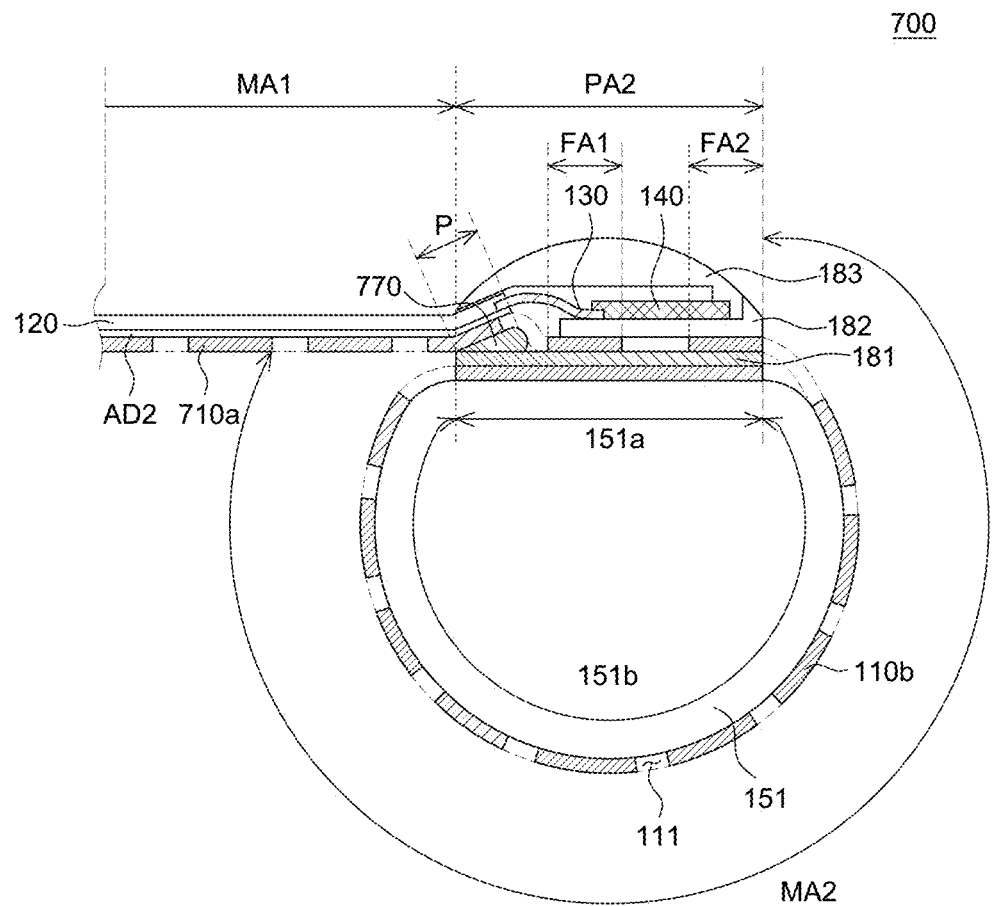
FIG. 7A and FIG. 7B are cross-sectional views of a display device according to another exemplary embodiment of the present disclosure.
Figure 7B:
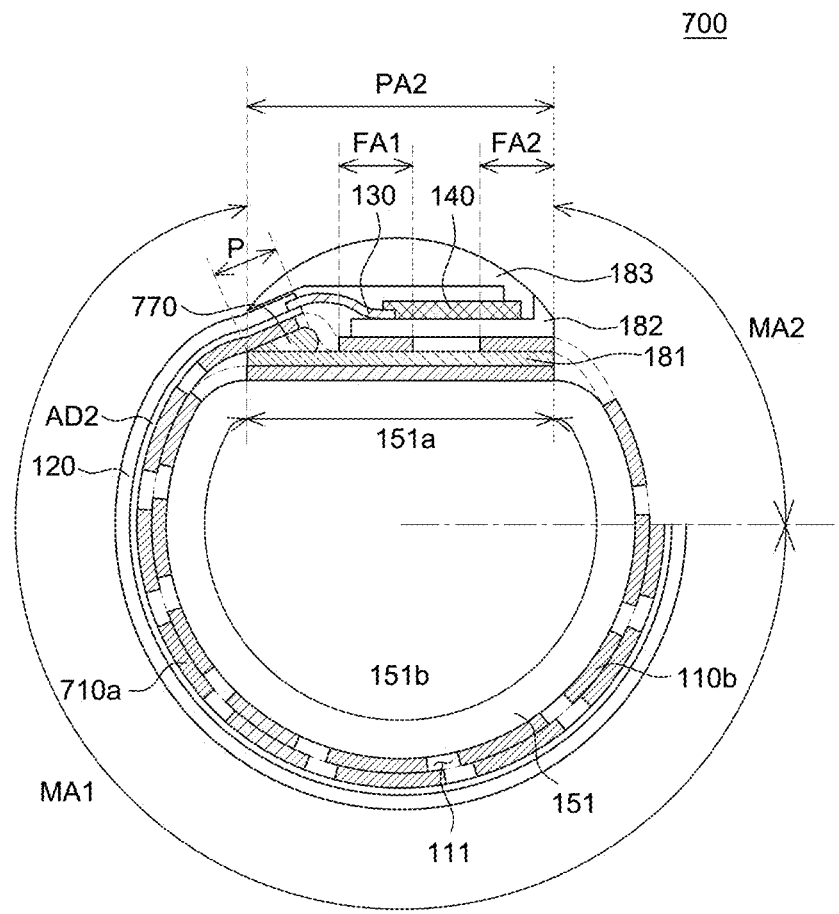

FIG. 7A and FIG. 7B are cross-sectional views of a display device according to another exemplary embodiment of the present disclosure. FIG. 7A is a cross-sectional view illustrating a state where the second back cover 110b is wound around the roller 151. FIG. 7B is a cross-sectional view illustrating a state where a part of a first back cover 710a is further wound around the roller 151. A display device 700 illustrated in FIG. 7A and FIG. 7B has substantially the same configuration as the display device 100 illustrated in FIG. 1A through FIG. 6B except a back cover 710 and a support member 770. Therefore, redundant description of the same components will not be provided.

Referring to FIG. 7A and FIG. 7B, the support member 770 is disposed between the base plate 181 and the first back cover 710a in the pad area P. The support member 770 is disposed on an upper surface of the base plate 181 so that one surface of the support member 770 may be in contact with a rear surface of the first back cover 710a. Thus, the first back cover 710a is disposed along the shape of the support member 770. Accordingly, one surface of the first back cover 710a may have an inclination corresponding to that of one surface of the support member 770.

Thus, in the display device 700 according to another exemplary embodiment of the present disclosure, the support member 770 is disposed between the back cover 710 and the base plate 181. Thus, during winding or unwinding of the display device 700, stress applied to the display panel 120 and the back cover 710 may be reduced. Specifically, the support member 770 may have an inclined surface. Thus, the support member 770 may support inclination of the back cover 710 and the pad area P of the display panel 120 disposed to be inclined toward the flat portion 151a between the base plate 181 and the back cover 710. Therefore, the back cover 710 and the pad area P are disposed along the shape of the support member 770 so as to be inclined on the inclined surface of the support member 770. Accordingly, before the pad area P is wound, the pad area P and the back cover 710 are disposed to be applied with compressive stress. Then, when the pad area P is wound, compressive stress applied to the back cover 710 and the pad area P decreases, and, thus, the generation of tensile stress may be reduced. Therefore, the back cover 710 and the pad area P are disposed according to inclination of the support member 770. Thus, during winding or unwinding of the display device 700, stress applied to the back cover 710 and the pad area P may be reduced and damage to the back cover 710 and the display panel 120 may be reduced.

<Protrusion of Back Cover>

Figure 8:
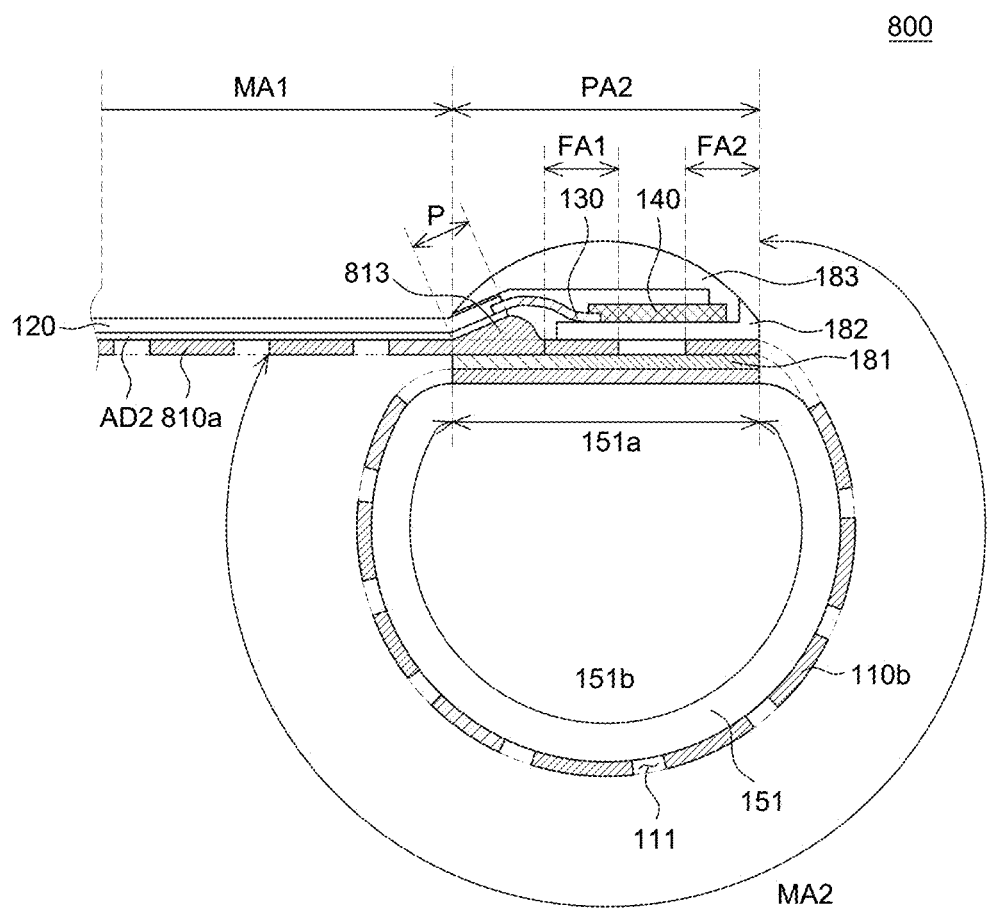
FIG. 8 is a cross-sectional view of a display device according to yet another exemplary embodiment of the present disclosure.

FIG. 8 is a cross-sectional view of a display device according to yet another exemplary embodiment of the present disclosure. A display device 800 illustrated in FIG. 8 has substantially the same configuration as the display device 100 illustrated in FIG. 1 through FIG. 6B except a back cover 810. Therefore, redundant description of the same components will not be provided.

Referring to FIG. 8, the back cover 810 includes a protrusion 813. The protrusion 813 of the back cover 810 may correspond to the pad area P of the display panel 120 and protrude from one surface of a first back cover 810a of the back cover 810 toward the top cover 183. The protrusion 813 may have an inclined surface corresponding to the pad area P. Thus, the protrusion 813 may be disposed under the pad area P of the display panel 120 to support the pad area P to be disposed to be inclined.

In the display device 800 according to yet another exemplary embodiment of the present disclosure, the protrusion 813 is disposed on the back cover 810 so that the pad area P of the display panel 120 may be disposed to be inclined toward the flat portion 151a. Thus, during winding or unwinding of the display device 800, stress applied to the pad area P of the display panel 120 may be reduced. Specifically, the protrusion 813 of the back cover 810 may have an inclined surface. Also, the pad area P of the display panel 120 may be disposed to be inclined toward the flat portion 151a by the inclined surface of the protrusion 813. Thus, the protrusion 813 under the pad area P may support inclination of the pad area P. Accordingly, before the pad area P is wound, the pad area P is disposed to be applied with compressive stress. Then, when the pad area P is wound, compressive stress applied to the pad area P decreases, and, thus, the generation of tensile stress may be reduced. Therefore, the protrusion 813 of the back cover 810 is disposed to support the inclined pad area P of the display panel 120. Thus, during winding or unwinding of the display device 800, stress applied to the pad area P may be reduced and damage to the display panel 120 may be reduced.

Also, the display device 800 according to yet another exemplary embodiment of the present disclosure may not use a separate component to dispose the pad area P to be inclined. That is, when the back cover 810 is manufactured, the back cover 810 may be configured including the protrusion 813 so as to support inclination of the pad area P. Therefore, the configuration of the display device 800 according to yet another exemplary embodiment of the present disclosure may be more simplified. Also, the manufacturing cost and time may be reduced.

<Protrusion of Base Plate>

Figure 9:
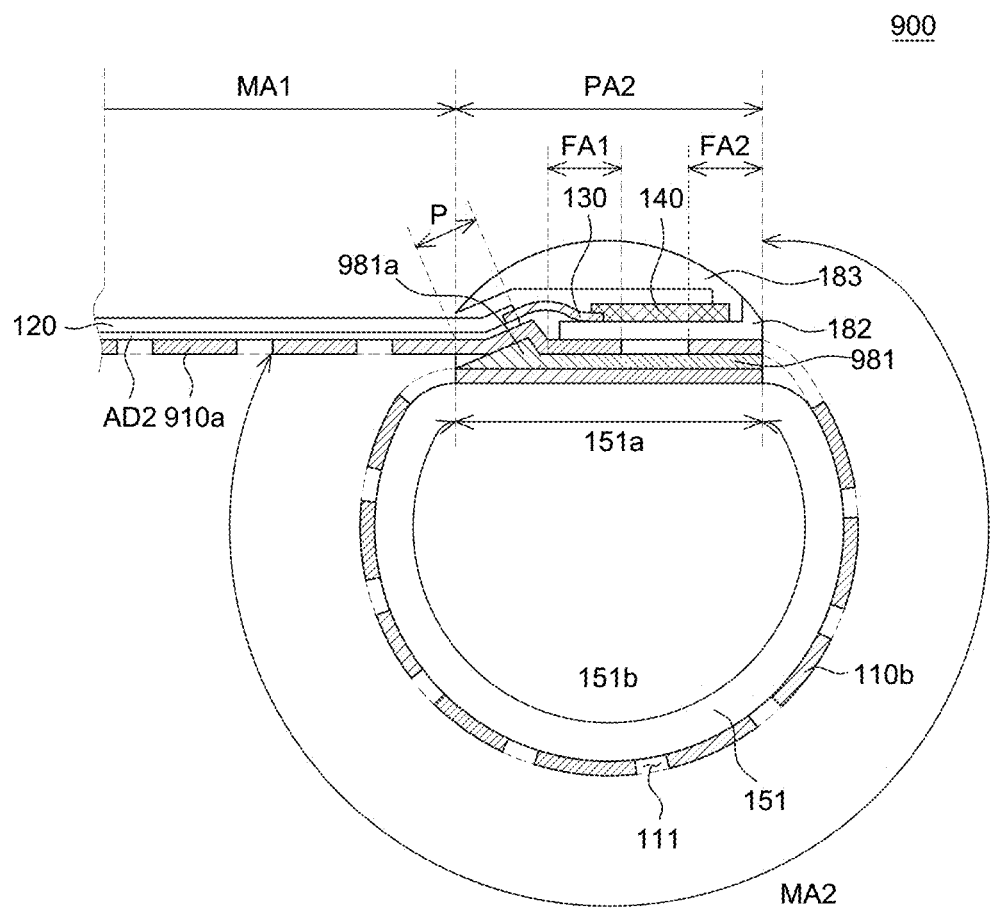
FIG. 9 is a cross-sectional view of a display device according to still another exemplary embodiment of the present disclosure.

FIG. 9 is a cross-sectional view of a display device according to still another exemplary embodiment of the present disclosure. A display device 900 illustrated in FIG. 9 has substantially the same configuration as the display device 100 illustrated in FIG. 1 through FIG. 6B except a back cover 910 and a base plate 981. Therefore, redundant description of the same components will not be provided.

Referring to FIG. 9, the base plate 981 includes a protrusion 981a. the protrusion 981a of the base plate 981 may correspond to the pad area P and protrude from one surface of the base plate 981 toward the top cover 183. The protrusion 981a may have an inclined surface corresponding to the pad area P. Thus, the protrusion 981a may be disposed under the pad area P of the display panel 120 and the back cover 910 to support the pad area P and the back cover 910 to be disposed to be inclined.

Referring to FIG. 9, the end of the base plate 981 may be disposed corresponding to the end of the flat portion 151a of the roller 151. For example, if the end of the base plate 981 protrudes more than the end of the flat portion 151a of the roller 151, the base plate 981 may interfere with winding of the back cover 110 and the display panel 120 along the curve of the roller 151. Therefore, the end of the base plate 981 is disposed corresponding to the end of the flat portion 151a of the roller 151. Thus, during winding of the display device 900, it is possible to reduce interference with winding of the back cover 110 and the display panel 120 by the base plate 981.

Meanwhile, FIG. 9 illustrates that the protrusion 981a of the base plate 981 has two inclined surfaces, but is not limited thereto. The protrusion 981a of the base plate 981 may be formed to have only one inclined surface corresponding to the inclination of the pad area P.

In the display device 900 according to still another exemplary embodiment of the present disclosure, the protrusion 981a is disposed on the base plate 981 so that the pad area P of the display panel 120 may be disposed to be inclined toward the flat portion 151a. Thus, during winding or unwinding of the display device 900, stress applied to the back cover 910 and the pad area P of the display panel 120 may be reduced. Specifically, the protrusion 981a of the base plate 981 may have an inclined surface. Also, the back cover 910 and the pad area P of the display panel 120 may be disposed to be inclined toward the flat portion 151a by the inclined surface of the protrusion 981a of the base plate 981. Thus, the protrusion 981a of the base plate 981 may support the pad area P and the back cover 910. Accordingly, before the pad area P is wound, the back cover 910 and the pad area P are disposed to be applied with compressive stress. Then, when the pad area P is wound, compressive stress applied to the back cover 910 and the pad area P decreases, and, thus, the generation of tensile stress may be reduced. Therefore, the inclined surface of the protrusion 981a of the base plate 981 is disposed to support inclination of the pad area P and the back cover 910. Thus, during winding or unwinding of the display device 900, stress applied to the pad area P and the back cover 910 may be reduced and damage to the display panel 120 and the back cover 910 may be reduced.

Also, the display device 900 according to still another exemplary embodiment of the present disclosure may not use a separate component to dispose the pad area P to be inclined. That is, when the base plate 981 is manufactured, the base plate 981 may be configured including the protrusion 981a so as to support the inclination of the pad area P. Therefore, the configuration of the display device 900 according to still another exemplary embodiment of the present disclosure may be simplified. Also, the manufacturing cost and time may be reduced.

<Inclined Surface of Bottom Cover>

Figure 10:
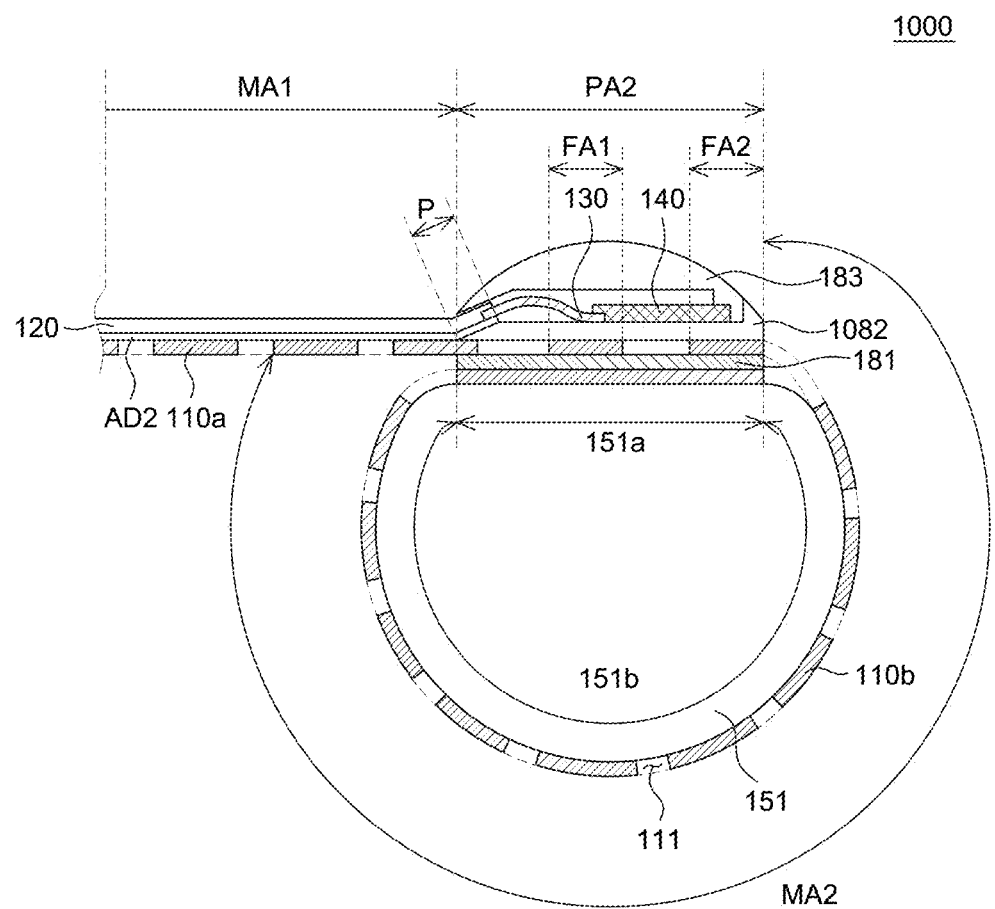
FIG. 10 is a cross-sectional view of a display device according to still another exemplary embodiment of the present disclosure.

FIG. 10 is a cross-sectional view of a display device according to still another exemplary embodiment of the present disclosure. A display device 1000 illustrated in FIG. 10 has substantially the same configuration as the display device 100 illustrated in FIG. 1 through FIG. 6B except a bottom cover 1082. Therefore, redundant description of the same components will not be provided.

Referring to FIG. 10, the bottom cover 1082 may have an inclined surface corresponding to the pad area P of the display panel 120. The one surface of the bottom cover 1082 may be inclined at the same inclination as the pad area P and disposed under the pad area P to support the pad area P. In this case, the bottom cover 1082 may be disposed between the display panel 120 and the back cover 110 and on the back cover 110 to support the pad area P.

Referring to FIG. 10, the end of the bottom cover 1082 may be disposed corresponding to the end of the flat portion 151a of the roller 151. For example, if the end of the bottom cover 1082 protrudes more than the end of the flat portion 151a of the roller 151, the bottom cover 1082 may interfere with winding of the back cover 110 and the display panel 120 along the curve of the roller 151. Therefore, the end of the bottom cover 1082 is disposed corresponding to the end of the flat portion 151a of the roller 151. Thus, during winding of the display device 1000, it is possible to reduce interference with winding of the back cover 110 and the display panel 120 by the bottom cover 1082.

In the display device 1000 according to still another exemplary embodiment of the present disclosure, the bottom cover 1082 has an inclined surface. Thus, during winding or unwinding of the display device 1000, stress applied to the pad area P of the display panel 120 may be reduced. Specifically, the inclined surface of the bottom cover 1082 may be disposed under the pad area P to support the pad area P. Accordingly, before the pad area P is wound, the pad area P is disposed to be applied with compressive stress. Then, when the pad area P is wound, compressive stress applied to the pad area P decreases, and, thus, the generation of tensile stress may be reduced. Therefore, one surface of the bottom cover 1082 may be inclined at an inclination corresponding to the pad area P and disposed to support the pad area P. Thus, during winding or unwinding of the display device 1000, stress applied to the pad area P may be reduced and damage to the display panel 120 may be reduced.

Also, the display device 1000 according to still another exemplary embodiment of the present disclosure may not use a separate component to dispose the pad area P to be inclined. That is, when the bottom cover 1082 is manufactured, the bottom cover 1082 may be configured including an inclined surface corresponding to the pad area P so as to support inclination of the pad area P. Therefore, the configuration of the display device 1000 according to still another exemplary embodiment of the present disclosure may be more simplified. Also, the manufacturing cost and time may be reduced.

<Groove of Bottom Cover>

Figure 11A:
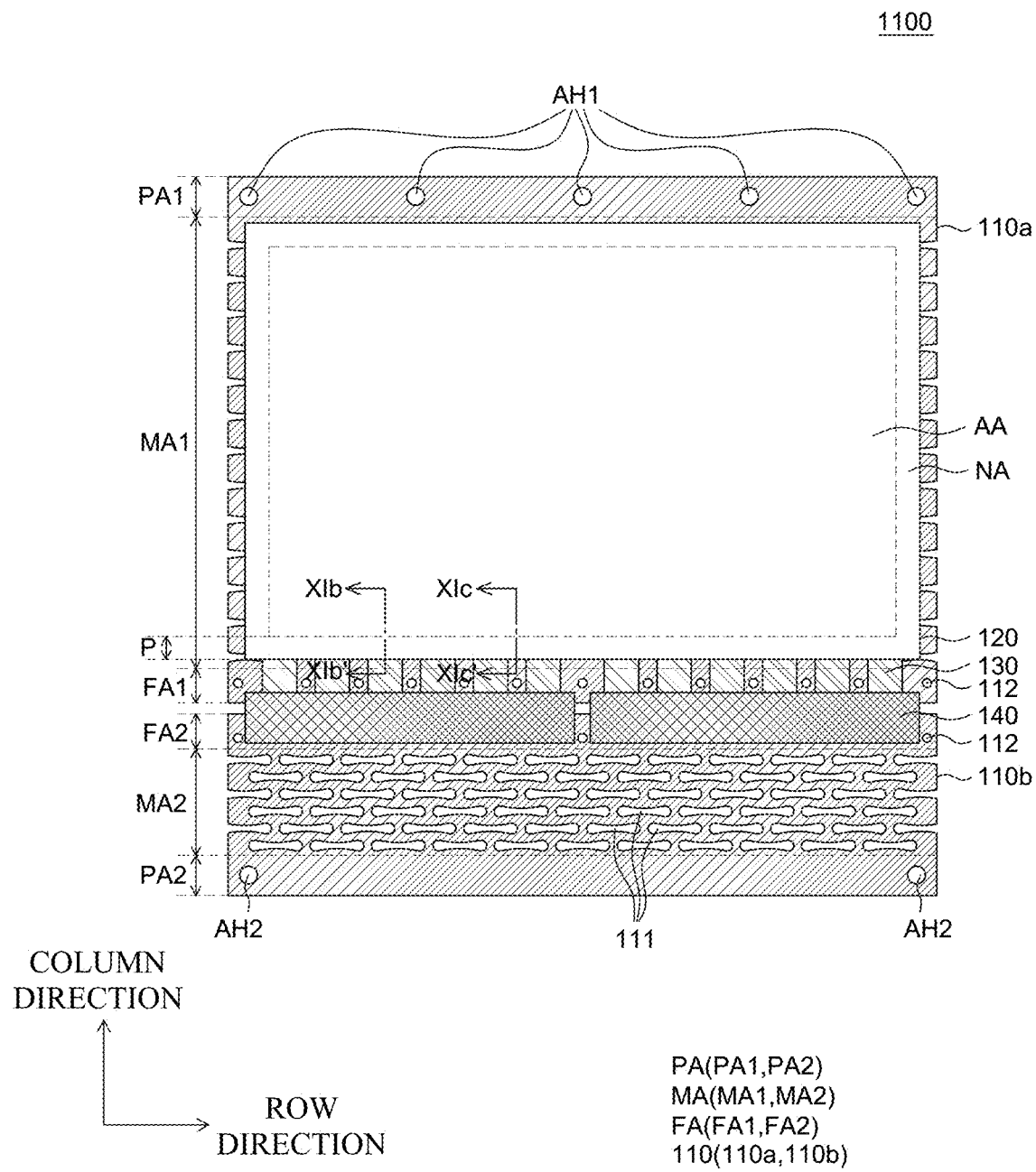
FIG. 11A is a plan view of a display device according to still another exemplary embodiment of the present disclosure.
Figure 11B:
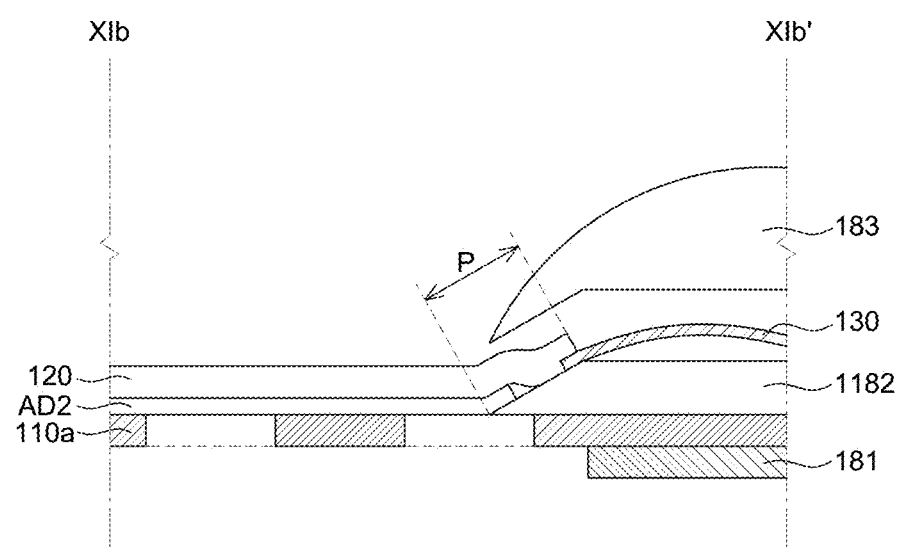
FIG. 11B is a cross-sectional view as taken along a line XIb-XIb' of FIG. 11A.
Figure 11C:
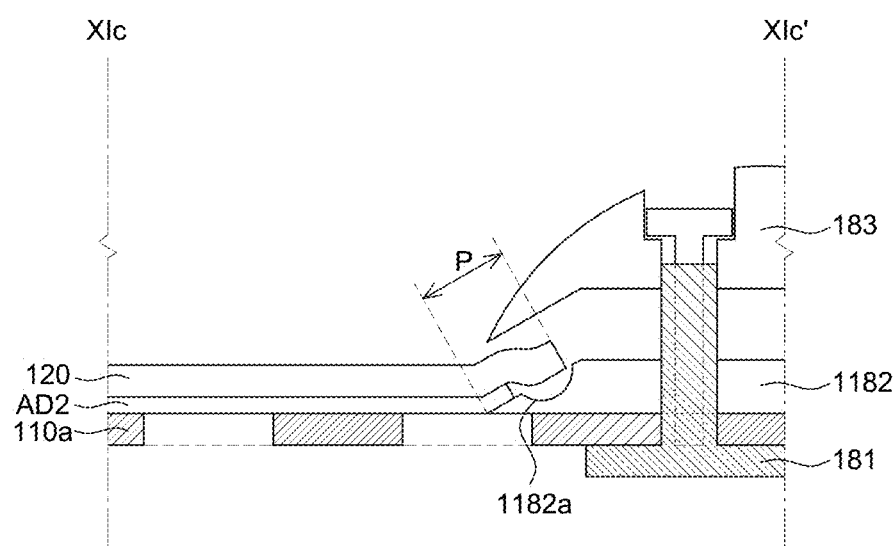
FIG. 11C is a cross-sectional view as taken along a line XIc-XIc' of FIG. 11A.

FIG. 11A is a plan view of a display device according to still another exemplary embodiment of the present disclosure. FIG. 11B is a cross-sectional view as taken along a line XIb-XIb' of FIG. 11A. FIG. 11C is a cross-sectional view as taken along a line XIc-XIc' of FIG. 11A. A display device 1100 illustrated in FIG. 11A through FIG. 11C has substantially the same configuration as the display device 1000 illustrated in FIG. 10 except a bottom cover 1182. Therefore, redundant description of the same components will not be provided.

Referring to FIG. 11A and FIG. 11B, the bottom cover 1182 is disposed in order for one surface of the bottom cover 1182 to support the pad area P of the display panel 120 in an area where at least one flexible film 130 is disposed. That is, the bottom cover 1182 is disposed on the first back cover 110a so as to support the pad area P, and at least one flexible film 130 is disposed on the bottom cover 1182. In this case, the second adhesive layer AD2 may fix the display panel 120 and the bottom cover 1182 in an area where at least one flexible film 130 is not disposed.

Next, referring to FIG. 11A and FIG. 11C, the bottom cover 1182 includes at least one groove 1182a. The groove 1182a of the bottom cover 1182 may be disposed on one surface of the bottom cover 1182 that supports the pad area P in an area corresponding to a space between the flexible films 130, i.e., an area where at least one flexible film 130 is not disposed. Also, the groove 1182a of the bottom cover 1182 may be disposed so as not to overlap the second adhesive layer AD2. Thus, the end of the pad area P of the display panel 120 may be spaced apart from the bottom cover 1182. FIG. 11C illustrates that the bottom cover 1182 includes the groove 1182a, but the present disclosure is not limited thereto. A hole may be disposed in one surface of the bottom cover 1182.

In the display device 1100 according to still another exemplary embodiment of the present disclosure, the groove 1182a is disposed on one surface of the bottom cover 1182 corresponding to a space between the flexible films 130. Thus, during winding of the display device 1100, stress applied to the pad area P may be reduced. For example, during winding of the display device 1100, the display panel 120 is applied with higher stress between the flexible films 130 than in the area where at least one flexible film 130 is disposed. Also, the display panel 120 is cracked earlier between the flexible films 130, and, thus, stress and cracks may be transmitted to the area where at least one flexible film 130 is disposed. Further, if the display panel 120 is fixed to the bottom cover 1182 by the second adhesive layer AD2, stress applied to the display panel 120 during winding of the display device 1100 may increase, as compared with a case where the display panel 120 is spaced apart from the bottom cover 1182. Therefore, in the display device 1100 according to still another exemplary embodiment of the present disclosure, the groove 1182a is disposed on one surface of the bottom cover 1182. Thus, the display panel 120 corresponding to the space between the flexible films 130 may be spaced apart from the bottom cover 1182 in an area where the second adhesive layer AD2 is not disposed. Therefore, stress applied to the display panel 120 corresponding to the space between the flexible films 130 may be reduced, and, thus, it is possible to reduce the occurrence of cracks. Also, it is possible to reduce the transmission of cracks occurring in a portion of the display panel 120 corresponding to the space between the flexible films 130 to a portion of the display panel 120 disposed in the area where at least one flexible film 130 is disposed.

<Angle of Inclination of Pad Area>

Figure 12A:
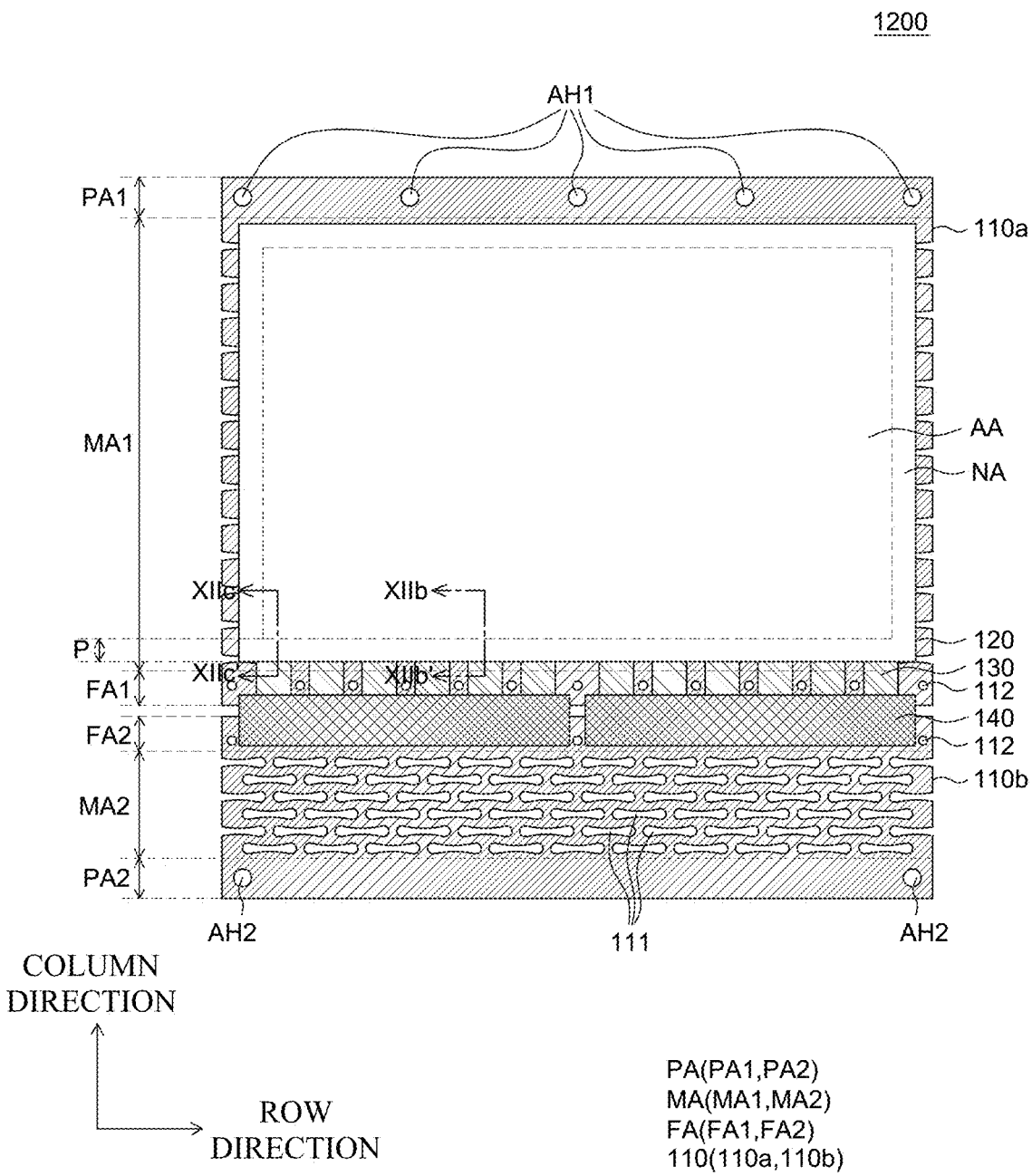
FIG. 12A is a plan view of a display device according to still another exemplary embodiment of the present disclosure.
Figure 12B:
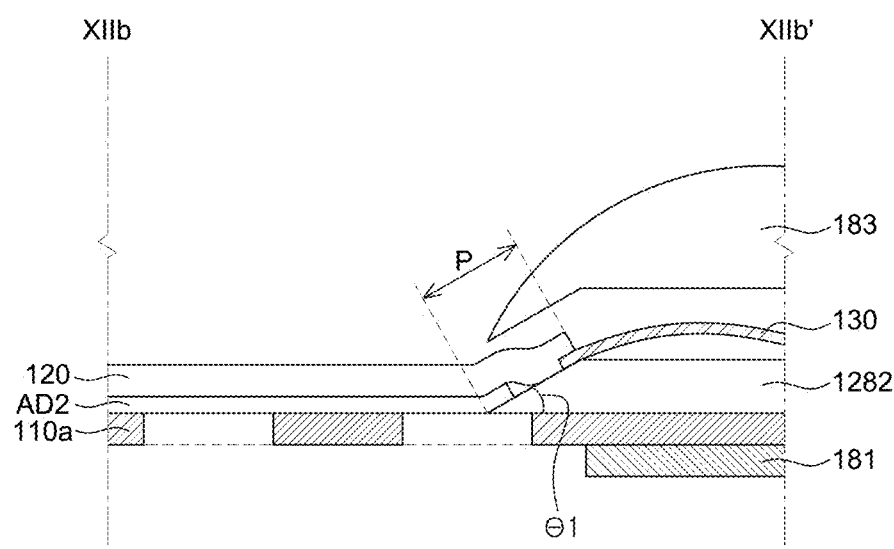
FIG. 12B is a cross-sectional view as taken along a line XIIb-XIIb' of FIG. 12A.
Figure 12C:
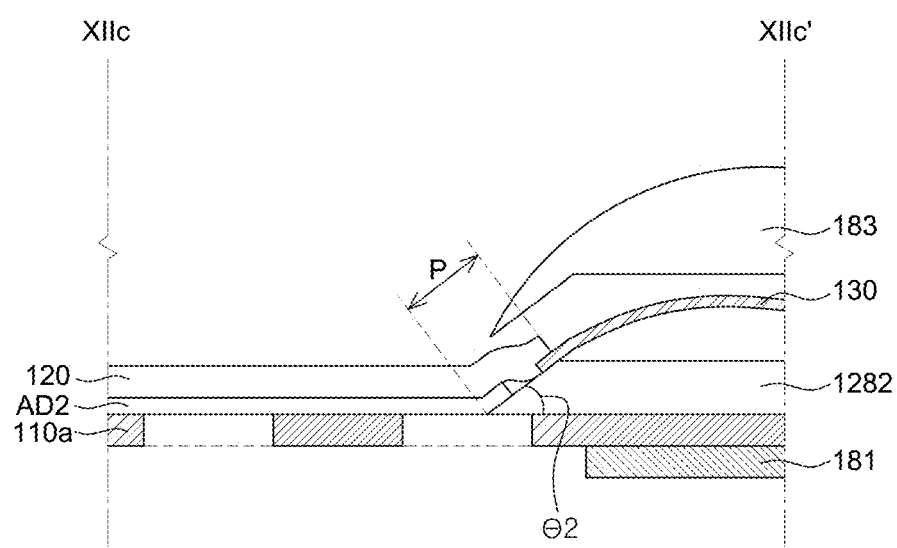
FIG. 12C is a cross-sectional view as taken along a line XIIc-XIIc' of FIG. 12A.

FIG. 12A is a plan view of a display device according to still another exemplary embodiment of the present disclosure. FIG. 12B is a cross-sectional view as taken along a line XIIb-XIIb' of FIG. 12A. FIG. 12C is a cross-sectional view as taken along a line XIIc-XIIc' of FIG. 12A. A display device 1200 illustrated in FIG. 12A through FIG. 12C has substantially the same configuration as the display device 1000 illustrated in FIG. 10 except a bottom cover 1282. Therefore, redundant description of the same components will not be provided.

Referring to FIG. 12A through FIG. 12C, in the pad area P of the display panel 120, an angle of inclination $\theta 2$ on both sides of the display panel 120 may be higher than an angle of inclination $\theta 1$ at a central portion. In this case, the pad area P is supported by an inclined surface of the bottom cover 1282 having the same inclination, and, thus, the pad area P may have the same angle of inclination as the one surface of the bottom cover 1282. The angles of inclination $\theta 1$ and $\theta 2$ of the pad area P may gradually increase from the central portion of the display panel 120 toward the both sides of the display panel 120. However, the present disclosure is not limited thereto. The pad area P may be grouped with one or more pad areas P adjacent thereto, and the angles of inclination thereof may increase on a group unit basis.

Meanwhile, FIG. 12A through FIG. 12C illustrate that the bottom cover 1282 is used to regulate the angles of inclination $\theta 1$ and $\theta 2$ of the pad area P of the display panel 120, but the present disclosure is not limited thereto. Another structure such as the support member 170 of the display device 100 in FIG. 1A through FIG. 6B, the support member 770 of the display device 700 in FIG. 7A and FIG. 7B, the back cover 810 of the display device 800 in FIG. 8 or the structure such as the base plate 981 of the display device 900 in FIG. 9 may support the pad area P of the display panel 120.

In the display device 1200 according to still another exemplary embodiment of the present disclosure, the angle of inclination of the pad area P on both sides of the back cover 110 may be set higher than the angle of inclination of the pad area P at a central portion of the back cover 110. Thus, during winding of the display device 1200, damage to the display panel 120 on the both sides of the back cover 110 may be reduced. Further, during winding of the display device 1200, the both sides of the display panel 120 are applied with higher stress than the central portion of the display panel 120. Therefore, the strain may be higher on both sides of the display panel 120 than at the central portion of the display panel 120. Accordingly, the pad area P on the both sides of the display panel is applied with higher stress than the pad area P at the central portion of the display panel and thus the pad area P on the both sides of the display panel may be more easily damaged. Thus, the angle of inclination $\theta 2$ of the pad area P on the both sides of the display panel 120 may be set higher than the angle of inclination $\theta 1$ of the pad area P at the central portion of the display panel 120. Therefore, damage to the pad area P on the both sides of the back cover 110 may be reduced.

Comparative Embodiment and Exemplary Embodiment

The following Table 1 is provided to compare a decrement in maximum tensile strain between a display device according to Comparative Embodiment and the display device 100 according to an exemplary embodiment of the present disclosure. The maximum tensile strain is obtained by measuring a strain of a display panel caused by tensile stress applied to the display panel disposed on a flat portion adjacent to a curved portion of a roller during winding of a display device, based on a state before winding of the display device. The display device according to Comparative Embodiment is substantially the same as the display device 100 according to an exemplary embodiment of the present disclosure except that the support member 170 is not disposed. In both the display device according to Comparative Embodiment and the display device 100 according to an exemplary embodiment of the present disclosure, the thickness of the base plate 181 was set to from about 0.9 mm to about 1.2 mm. Also, the thickness of the back cover 110 was set to from about 0.2 mm to about 0.3 mm and the thickness of the bottom cover 182 was set to from about 2.0 mm to about 5.0 mm. Further, the thickness of the top cover 183 was set to from about 10.0 mm to about 15.0 mm. Further, the support member 170 was set as a plastic-based material having a right triangle shape in which the lower side in contact with the back cover 110 has a length of about 3.5 mm and the side extended vertically from the lower side has a length of about 2.5 mm.

Referring to Table 1, it may be seen that the display device 100 according to an exemplary embodiment of the present disclosure shows a decrement in maximum tensile strain by about 50.94%, compared with the display device according to Comparative Embodiment.

TABLE 1

|  | Comparative Embodiment | Display device 100 | Decrement |
|---|---|---|---|
| Maximum tensile strain | 0.53% | 0.26% | 50.94% |

The exemplary embodiments of the present disclosure can also be described as follows:

According to an aspect of the present disclosure, a display device includes a display panel including an active area in which a plurality of pixels is defined and a pad area in which pads for applying signals to the plurality of pixels are placed; a back cover placed to overlap the display panel; and a roller configured to wind or unwind the back cover and the display panel and including a flat portion and a curved portion, wherein the pad area is placed to be inclined toward the flat portion.

The display device may further include a support member having an inclined surface corresponding to the pad area and configured to support the pad area.

An end of the support member may correspond to an end of the flat portion.

The support member may be placed between the display panel and the back cover.

The display device may further include a base plate placed under the back cover and combined to the back cover, wherein the support member is placed between the base plate and the back cover, and the back cover is placed to be inclined along a shape of the support member.

The support member may be made of a plastic-based material.

The back cover may include a protrusion placed under the pad area, and the protrusion may have an inclined surface corresponding to the pad area.

The display device may further include a base plate placed to support a part of a surface opposite to one surface of the back cover on which the display panel is disposed; a top cover combined with the base plate to fix the back cover interposed between the top cover and the base plate; and a bottom cover placed between the base plate and the top cover.

The base plate may include a protrusion placed under the pad area and the back cover, and the protrusion may have an inclined surface corresponding to the pad area.

The base plate may have an inclined surface corresponding to an inclination of the pad area.

The bottom cover may have an inclined surface corresponding to the pad area, and the inclined surface of the bottom cover is placed between the display panel and the back cover.

The display device may further include at least one flexible film placed in the pad area, wherein the inclined surface of the bottom cover includes at least one groove placed between the flexible films.

An angle of inclination of the pad area on both sides of the display panel may be higher than an angle of inclination of the pad area at a central portion of the display panel.

According to another aspect of the present disclosure, a display device includes a display panel configured to display images and including an active area and a pad area which is extended from one side of the active area and to which a flexible film is attached; a back cover configured to be rolled up together with the display panel; and a roller including a flat portion and a curved portion, wherein the pad area is placed to be inclined toward a part of the display panel except the pad area.

The display device may further include a support member may be placed between the pad area and the flat portion and having an inclined surface corresponding to the pad area.

The display device may further include a base plate placed on the flat portion; a top cover configured to fix the back cover and the display panel placed on the base plate; and a bottom cover placed between the base plate and the top cover wherein the top cover has an inclined surface corresponding to the pad area.

The base plate may have an inclined surface corresponding to the pad area, and the back cover and the display panel are supported by the inclined surface.

The bottom cover may have an inclined surface that supports the pad area between the pad area and the back cover, and an end of the bottom cover corresponds to an end of the flat portion.

It will be apparent to those skilled in the art that various modifications and variations can be made in the display device of the present disclosure without departing from the technical idea or scope of the disclosure. Thus, it is intended that the present disclosure cover the modifications and variations of this disclosure provided they come within the scope of the appended claims and their equivalents.

What is claimed is:

1. A display device, comprising:
   a display panel including an active area in which a plurality of pixels is defined and a pad area in which pads for applying signals to the plurality of pixels are placed;
   a back cover placed to overlap the display panel;
   a flexible film attached to the pad area;
   a support member having an inclined surface corresponding to the pad area and configured to support the pad area, the support member being disposed between the flexible film and the back cover; and
   a roller configured to wind or unwind the back cover and the display panel and including a flat portion and a curved portion,
   wherein the pad area is placed to be inclined toward the flat portion.

2. The display device according to claim 1, wherein an end of the support member corresponds to an end of the flat portion.

3. The display device according to claim 1, wherein the support member is placed between the display panel and the back cover.

4. The display device according to claim 1, further comprising:
a base plate placed under the back cover and combined to the back cover,
wherein the support member is placed between the base plate and the back cover, and
the back cover is placed to be inclined along a shape of the support member.

5. The display device according to claim 1, wherein the support member is made of a plastic-based material.

6. The display device according to claim 1, wherein the back cover includes a protrusion placed under the pad area, and
the protrusion has an inclined surface corresponding to the pad area.

7. The display device according to claim 1, further comprising:
a base plate placed to support a part of a surface opposite to one surface of the back cover on which the display panel is disposed;
a top cover combined with the base plate to fix the back cover interposed between the top cover and the base plate; and
a bottom cover placed between the base plate and the top cover.

8. The display device according to claim 7, wherein the base plate includes a protrusion placed under the pad area and the back cover, and
the protrusion has an inclined surface corresponding to the pad area.

9. The display device according to claim 7, wherein the base plate has an inclined surface corresponding to an inclination of the pad area.

10. The display device according to claim 7, wherein the bottom cover has an inclined surface corresponding to the pad area, and
the inclined surface of the bottom cover is placed between the display panel and the back cover.

11. The display device according to claim 10, further comprising:
at least one flexible film placed in the pad area,
wherein the inclined surface of the bottom cover includes at least one groove placed between the flexible films.

12. The display device according to claim 7, wherein a part of an inner peripheral surface of the top cover corresponding to the pad area has an inclined surface at the same inclination as the pad area.

13. The display device according to claim 1, wherein an angle of inclination of the pad area on both sides of the display panel is higher than an angle of inclination of the pad area at a central portion of the display panel.

14. A display device, comprising:
a display panel configured to display images and including an active area and a pad area which is extended from one side of the active area and to which a flexible film is attached;
a back cover configured to be rolled up together with the display panel;
a roller configured to wind or unwind the back cover and the display panel and including a flat portion and a curved portion; and
a support member having an inclined surface corresponding to the pad area, the support member being disposed between the flexible film and the back cover,
wherein the pad area is placed to be inclined toward a part of the display panel except the pad area.

15. The display device according to claim 14, further comprising:
a base plate placed on the flat portion;
a top cover configured to fix the back cover and the display panel placed on the base plate; and
a bottom cover placed between the base plate and the top cover,
wherein the top cover has an inclined surface corresponding to the pad area.

16. The display device according to claim 15, wherein the base plate has an inclined surface corresponding to the pad area, and
the back cover and the display panel are supported by the inclined surface.

17. The display device according to claim 15, wherein the bottom cover has an inclined surface that supports the pad area between the pad area and the back cover, and
an end of the bottom cover corresponds to an end of the flat portion.

* * * * *